(12) United States Patent
Riedel et al.

(10) Patent No.: US 10,063,255 B2
(45) Date of Patent: Aug. 28, 2018

(54) STOCHASTIC COMPUTATION USING DETERMINISTIC BIT STREAMS

(71) Applicant: Regents of the University of Minnesota, Minneapolis, MN (US)

(72) Inventors: Marcus Riedel, Minneapolis, MN (US); Devon Jenson, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 15/618,530

(22) Filed: Jun. 9, 2017

(65) Prior Publication Data

US 2017/0359082 A1    Dec. 14, 2017

Related U.S. Application Data

(60) Provisional application No. 62/347,959, filed on Jun. 9, 2016.

(51) Int. Cl.
*H03M 7/00*  (2006.01)
*H03M 7/26*  (2006.01)
*H04B 1/16*  (2006.01)

(52) U.S. Cl.
CPC ............... *H03M 7/26* (2013.01); *H04B 1/16* (2013.01)

(58) Field of Classification Search
CPC .......... H03M 13/1111; H03M 13/6597; H03M 13/1137; H03M 13/1102; H03M 13/1128; H03M 13/1134; H03M 13/658; H03M 13/1171; H03M 13/255; H03M 13/1105; H03M 13/1108; H03M 13/1125; H03M 13/1165

(Continued)

(56) References Cited

U.S. PATENT DOCUMENTS 6,745,219 B1 *  6/2004  Zelkin ................... G06N 7/005
                                                  708/250
9,646,243 B1 *  5/2017  Gokmen ............. G06N 3/0635
(Continued)

OTHER PUBLICATIONS

Alaghi et al., "Fast and Accurate Computation using Stochastic Circuits," Design Automation and Test in Europe Conference and Exhibition, Mar. 24-28, 2014, IEEE online Apr. 21, 2014, 4 pp.

(Continued)

*Primary Examiner* — Linh Nguyen

(74) *Attorney, Agent, or Firm* — Shumaker & Sieffert, P.A.

(57) ABSTRACT

In some examples, a device includes an integrated circuit comprising a computational unit configured to process at least two input bit streams that each include a sequential set of data bits or two or more sets of data bits in parallel that is deterministically encoded to represent numerical values based on a probability that any data bit in the bit stream is high. In some examples, the computational unit includes a convolver configured to generate pair-wise bit combinations of the data bits of the input bit streams. In some examples, e computational unit further includes a stochastic computational unit configured to perform a computational operation on the pair-wise bit combinations and produce an output bit stream having a set of data bits indicating a result of the computational operation based on a probability that any data bit in the set of data bits of the output bit stream is high.

20 Claims, 14 Drawing Sheets

$a_0 a_1 a_2 a_3 \, a_0 a_1 a_2 a_3 \, a_0 a_1 a_2 a_3$
$b_0 b_1 b_2 \, b_0 b_1 b_2 \, b_0 b_1 b_2 \, b_0 b_1 b_2$

(58) Field of Classification Search
USPC .......................................... 341/74–78, 94–96
See application file for complete search history.

(56) References Cited

U.S. PATENT DOCUMENTS

| | | | | |
|---|---|---|---|---|
| 2008/0294970 | A1* | 11/2008 | Gross | H03M 13/1102 714/801 |
| 2011/0154150 | A1* | 6/2011 | Kang | H03M 13/1108 714/752 |
| 2011/0231731 | A1* | 9/2011 | Gross | H03M 13/1111 714/760 |
| 2013/0007551 | A1* | 1/2013 | Krishnan | H03M 13/1117 714/752 |
| 2013/0124164 | A1* | 5/2013 | Jha | G06F 17/50 703/2 |
| 2017/0109628 | A1* | 4/2017 | Gokmen | G06N 3/088 |
| 2017/0188174 | A1* | 6/2017 | Lee | H04S 7/307 |
| 2017/0192752 | A1* | 7/2017 | Bradbury | G06F 7/588 |

OTHER PUBLICATIONS

Alaghi et al., "Stochastic Circuits for Real-Time Image-Processing Applications," Proceedings of the 50th Annual Design Automation Conference, May 29-Jun. 7, 2013, 6 pp.

Alaghi et al., "Survey of Stochastic Computing," ACM Transactions on Embedded Computing Systems, vol. 12, No. 2s, Article 92, May 2013, 19 pp.

Chapiro, "Globally-Asynchronous Locally-Synchronous Systems," Dissertation submitted to the Department of Computer Science, Report No. STAN-CS-84/1026, Stanford University, Oct. 1984, 138 pp.

Choi et al., A Magnetic Tunnel Junction Based True Random Number Generator with Conditional Perturb and Real-Time Output Probability Tracking, Electron Devices Meeting, Dec. 15-17, 2014, available from IEEE Feb. 23, 2015, 4 pp.

Friedman., "Clock Distribution Networks in Synchronous Digital Integrated Circuits," IEEE, vol. 89, No. 5, May 2001, 28 pp.

Gaines, "Stochastic Computing Systems, Chapter 2," Advances in Information System Science, 1969, 69 pp. (Applicant points out, in accordance with MPEP 609.04(a), that the year of publication, 1969, is sufficiently earlier than the effective U.S. filing date, Mar. 3, 2017, so that the particular month of publication is not in issue.).

Jenson et al., "A Deterministic Approach to Stochastic Computation," submitted to the 2016 International Conference on Computer Aided Design, Jun. 10, 2016, 8 pp.

Jiang et al., "Design of Mixed Synchronous/Asynchronous Systems with Multiple Clocks," IEEE Transactions on Parallel and Distributed Systems, vol. 26, No. 8, Aug. 2015, 14 pp.

Li et al., "A Low Power Fault-Tolerance Architecture for the Kernal Density Estimation Based Image Segmentation Algorithm," International Conference on Application Specific Systems, Architectures and Processors, Sep. 11-14, 2011, available from IEEE Oct. 13, 2011, 8 pp.

Li et al., "A Stochastic Reconfigurable Architecture for Fault-Tolerant Computation with Sequential Logic," 30th International Conference on Computer Design, IEEE, Sep. 30-Oct. 3, 2012, 6 pp.

Li et al., "An FPGA Implementation of a Restricted Boltzmann Machine Classifier Using Stochastic Bit Streams," Sep. 10, 2015, 2 pp.

Li et al., "Computation on Stochastic Bit Streams Digital Image Processing Case Studies," Transactions on Very Large Scale Integration (VLSI) Systems, vol. 22, Issue 3, Mar. 2014, available from IEEE Apr. 15, 2013, 14 pp.

Li et al., "The Synthesis of Complex Arithmetic Computation on Stochastic Bit Streams Using Sequential Logic," International Conference on Computer-Aided Design, Nov. 2012, 9 pp.

Liang et al., "Stochastic Modeling and Optimization in a Microgrid: A Survey," Energies, Mar. 31, 2014, 24 pp.

Mansinghka et al., "Stochastic Digital Circuits for Porbabilistic Inference," Computer Science and Artificial Intelligence Laboratory Technical Report, Massachusetts Institute of Technology, Nov. 23, 2008, 12 pp.

Naderi et al., "Delayed Stochastic Decoding of LDPC Codes," Transactions on Signal Processing, vol. 59, No. 11, IEEE, Nov. 2011, 10 pp.

Najafi et al., "A Fast Fault-Tolerant Architecture for Sauvola Local Image Thresholding Algorithm Using Stochastic Computing," Transactions on Very Large Scale Integration (VLSI) Systems, vol. 24. No. 2, IEEE, Feb. 2016, 5 pp.

Najafi et al., "Polysynchronous Stochastic Circuits," 21 Asia and South Pacific Design Automation Conference, Jan. 25-28, 2016, IEEE, 7 pp.

Brown et al., "Stochastic Neural Computation I: Computational Elements," IEEE Transactions on Computers, vol. 50, Issue 9, Sep. 2001, 15 pp.

Najafi et al., "Polysynchrous Clocking: Exploiting the Skew Tolerance of Stochastic Circuits," IEEE Transactions on Computers, vol. PP, Issue 99, Apr. 25, 2017, 11 pp.

Qian et al., "An Architecture for Fault-Tolerant Computation with Stochastic Logic," IEEE, Feb. 2011, 14 pp.

Qian et al., "Digital yet Deliberately Random: Synthesizing Logical Computation on Stochastic Bit Streams," Dissertation from the University of Minnesota, Jul. 2011, 185 pp.

Qian et al., "Synthesizing Logical Computation on Stochastic Bit Streams," Proceedings of IEEE, 2011, (Applicant points out, in accordance with MPEP 609.04(a), that the year of publication 2011, is sufficiently earlier than the effective U.S. filing date, so that the particular month of publication is not in issue.) 8 pp.

Qian et al., "The Synthesis of Robust Polynomial Arithmetic with Stochastic Logic," 45 Conference of Design Automation, IEEE, Jun. 8-13, 2008, 6 pp.

Qian et al., "The Synthesis of Stochastic Circuits for Nanoscale Computation: Chapter 18," International Journal of Nanotechnology and Molecular Computation, Oct.-Dec. 2009, 16 pp.

Ranjbar et al., "Using Stochastic Architectures for Edge Detection Algorithms," 23rd Iranian Conference on Electrical Engineering, May 10-14, 2015, available from IEEE Jul. 2, 2015, 6 pp.

Riedel, "Polysynchronous Clocking for Molecular Computing," MBMC Workshop, Dec. 4, 2015, 37 pp.

Tang et al., "True Random Number Generator Circuits Based on Single- and Multi-Phase Beat Frequency Detection," Proceedings of the Custom Integrated Circuits Conference, Sep. 15-17, 2014, available from IEEE Nov. 6, 2014, 4 pp.

Tehrani et al., Fully Parallel Stochastic LDPC Decoders, Transactions on Signal Processing, vol. 56, No. 11, IEEE, Nov. 2008, 12 pp.

Tehrani et al., "Majority-Based Tracking Forecast Memories for Stochastic LDPC Decoding," Transactions on Signal Processing, vol. 58, No. 9, IEEE, Sep. 2010, 14 pp.

Tehrani et al., "Stochastic Decoding of LDPC Codes," Communications Letters, vol. 10. No. 10, IEEE, Oct. 2006, 3 pp.

Wilhelm et al., "Stochastic Switching Circuit Synthesis," Information Theory, Jul. 6-11, 2008, IEEE online Aug. 8, 2008, 16 pp.

Zhu et al., "Binary Stochastic Implementation of Digital Logic," Proceedings of the 2014 AVM/SIGDA International Symposium on Field-programmable Gate Arrays, Feb. 2014, 9 pp.

Jenson et al., "A Deterministic Approach to Stochastic Computation," presentation acceptance at the International Workshop on Logic and Synthesis, Nov. 10, 2016, 8 pp.

U.S. Appl. No. 15/448,997, filed Mar. 3, 2017, by David J. Lilja.

* cited by examiner $$p_A = 1/3 = 100 \rightarrow 100\ 100\ 100$$
$$p_B = 2/3 = 110 \rightarrow 111\ 111\ 000$$

$$p_C = p_A p_B = 2/9$$

$$p_A = 1/3 = 100 \rightarrow 100\ 100\ 100$$
$$p_B = 2/3 = 110 \rightarrow 110\ 110\ 110$$
$$p_S = 2/3 = 110 \rightarrow 111\ 111\ 000$$

$$p_C = p_S p_A + (1 - p_S)p_B = 2/9 + 2/9 = 4/9$$

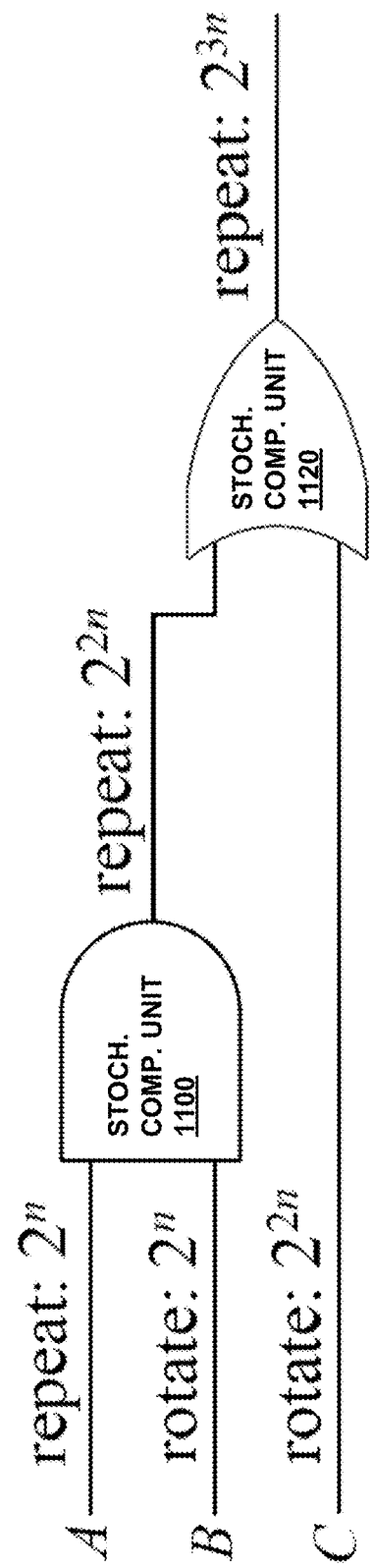

ns and, in par-
STOCHASTIC COMPUTATION USING DETERMINISTIC BIT STREAMS

This application claims the benefit of U.S. Provisional Patent Application No. 62/347,959 (filed Jun. 9, 2016), the entire content being incorporated herein by reference.

GOVERNMENT INTEREST

This invention was made with government support under CCF-1408123 awarded by the National Science Foundation. The government has certain rights in the invention.

TECHNICAL FIELD

The invention relates to electronic circuits and, in particular, performing arithmetic operations in electronic circuits.

BACKGROUND

In the paradigm of stochastic computation, digital logic may be used to perform computation on random bit streams, where numbers are represented by the probability of observing a one. A benefit of such a stochastic representation may be that complex operations can be performed with very simple logic. For instance, multiplication may be performed with a single AND gate and scaled addition can be performed with a single multiplexer unit. One drawback may be that the computation has very high latency, due to the length of the bit streams. Another drawback may be that the computation suffers from errors due to random fluctuations and correlations between the streams. These effects may worsen as the circuit depth and the number of inputs increase.

A certain degree of accuracy may be maintained by re-randomizing bit streams, but this is an additional expense. While the logic to perform the computation is simple, generating random or pseudorandom bit streams is costly. The random or pseudorandom sources required to generate the representation are costly, consuming a majority of the circuit area (and diminishing the overall gains in area). For example, pseudorandom constructs such as linear feedback shift registers (LFSRs) may account for as much as ninety percent of the area of stochastic circuit designs. This design may significantly diminish the area benefits.

SUMMARY

In general, this disclosure describes computational systems and circuits designed to generate and operate on deterministically generated bit streams using stochastic computational units. As described herein, this disclosure recognizes that randomness is not a requirement for the stochastic computational paradigm. Instead, the same computation can be performed on deterministically generated bit streams. The results may be completely accurate, with no random fluctuations. Without the requirement of randomness, a circuit may inexpensively generate bit streams. With this approach, the latency can be reduced by a factor of approximately $2^{-n}$, where n is the equivalent number of bits of precision.

For example, for the equivalent of ten bits of precision, the bit stream length is reduced from $2^{20}$, or approximately one million, to only $2^{10}$, or approximately one thousand.) As with stochastic computation, all bits in deterministic streams are weighted equally. Accordingly, deterministic circuits may display the same high degree of tolerance to soft errors. Computation can be performed on deterministic bit streams in a manner analogous to computation on stochastic bit streams.

This disclosure describes a number of bit stream generation circuits that use different techniques for the computation: relatively prime stream lengths, rotation, and clock division. Computational circuitry is described capable of implementing a collection of arithmetical functions and operations. Unlike conventional stochastic methods, circuitry described herein utilizing the deterministic bit stream generation techniques may achieve certain technical advantages, including more accurate results. In some examples, the cost of generating the deterministic streams may be a small fraction of the cost of generating streams from random/pseudorandom sources. Most importantly, the latency may be reduced by a factor of $$\frac{1}{2^n},$$

where n is the equivalent number of bits of precision.

In some examples, a device includes an integrated circuit comprising a computational unit configured to process at least a first input bit stream and a second input bit stream, wherein each input bit stream of the first input bit stream and second input bit stream comprises a sequential set of data bits or two or more sets of data bits in parallel, and wherein each set of data bits of the sets of data bits is deterministically encoded to represent numerical values based on a probability that any data bit in the respective set of data bits is high. The computational unit includes a convolver configured to generate pair-wise bit combinations of the data bits of the first input bit stream and the data bits of the second bit stream. The computational unit also includes a stochastic computational unit configured to perform a computational operation on the pair-wise bit combinations and produce an output bit stream having a set of data bits indicating a result of the computational operation, wherein the data bits of the output bit stream represent the result based on a probability that any data bit in the set of data bits of the output bit stream is high.

In some examples, a method of operating an integrated circuit includes a computational unit, includes receiving, at the computational unit, a first input bit stream and a second input bit stream, wherein each input bit stream of the first input bit stream and the second input bit stream comprises a sequential set of data bits or two or more sets of data bits in parallel, and wherein each set of data bits of the sets of data bits is deterministically encoded to represent numerical values based on a probability that any data bit in the respective set of data bits is high. The method further includes convolving the first input bit stream and the second input bit stream to generate pair-wise bit combinations of the data bits of the first input bit stream and the data bits of the second bit stream. The method also includes processing the pair-wise bit combinations with a stochastic computational unit to produce an output bit stream having a set of data bits indicating a result of a computational operation, wherein the data bits of the output bit stream represent the result based on a probability that any data bit in the set of data bits of the output bit stream is high.

In some examples, a method includes convolving two deterministically encoded bit streams of operands to produce convolved bit streams, wherein each encoded bit stream of the encoded bit streams represents a respective number by a fraction of ones versus zeroes. The method further includes processing the convolved bit streams with circuit structures implementing stochastic logic operations to perform an arithmetic operation on the convolved bit streams.

BRIEF DESCRIPTION OF DRAWINGS

FIG. 10 illustrates two example bit streams generated by the rotation method.

FIG. 11 is an example of an arbitrary multi-level circuit with bit streams generated by the rotation method.

DETAILED DESCRIPTION

This disclosure describes techniques for using stochastic computational logic on deterministic bit streams. In some examples, stochastic computational logic may include relatively simple logic gates, and the circuitry for generating deterministic bit streams may also be relatively simple. In addition, using stochastic computational logic on deterministic bit streams may allow for shorter input bit streams, as compared to using stochastic computational logic on random or pseudorandom bit streams.

In general, stochastic logic has been used to perform computation on data represented by random bit streams. The stochastic representation may allow complex arithmetic to be performed with very simple logic, but it often results in higher latency and relatively poor precision. Furthermore, the results of stochastic computation may be inaccurate due to random fluctuations.

As described herein, randomness is not necessarily a requirement for the stochastic computational paradigm. Instead, it is recognized herein that, if properly structured, the same arithmetical constructs can operate on deterministic bit streams, with the data represented uniformly by the fraction of 1's versus 0's.

This disclosure describes a number of computation systems configured to generate and operate on deterministic bit streams using stochastic computation circuitry. For example, systems and methods using relatively prime stream lengths, rotation, and clock division are described. The three example methods may be utilized with circuitry configured to perform a collection of arithmetical operations. Unlike conventional stochastic methods, the deterministic methods and circuitry discussed herein may produce completely accurate results. The cost of generating the deterministic streams may be a small fraction of the cost of generating streams from random/pseudorandom sources. Moreover, the latency may be reduced, such as by a factor of $$\frac{1}{2^n},$$

where n is the equivalent number of bits of precision.

Figure 1:
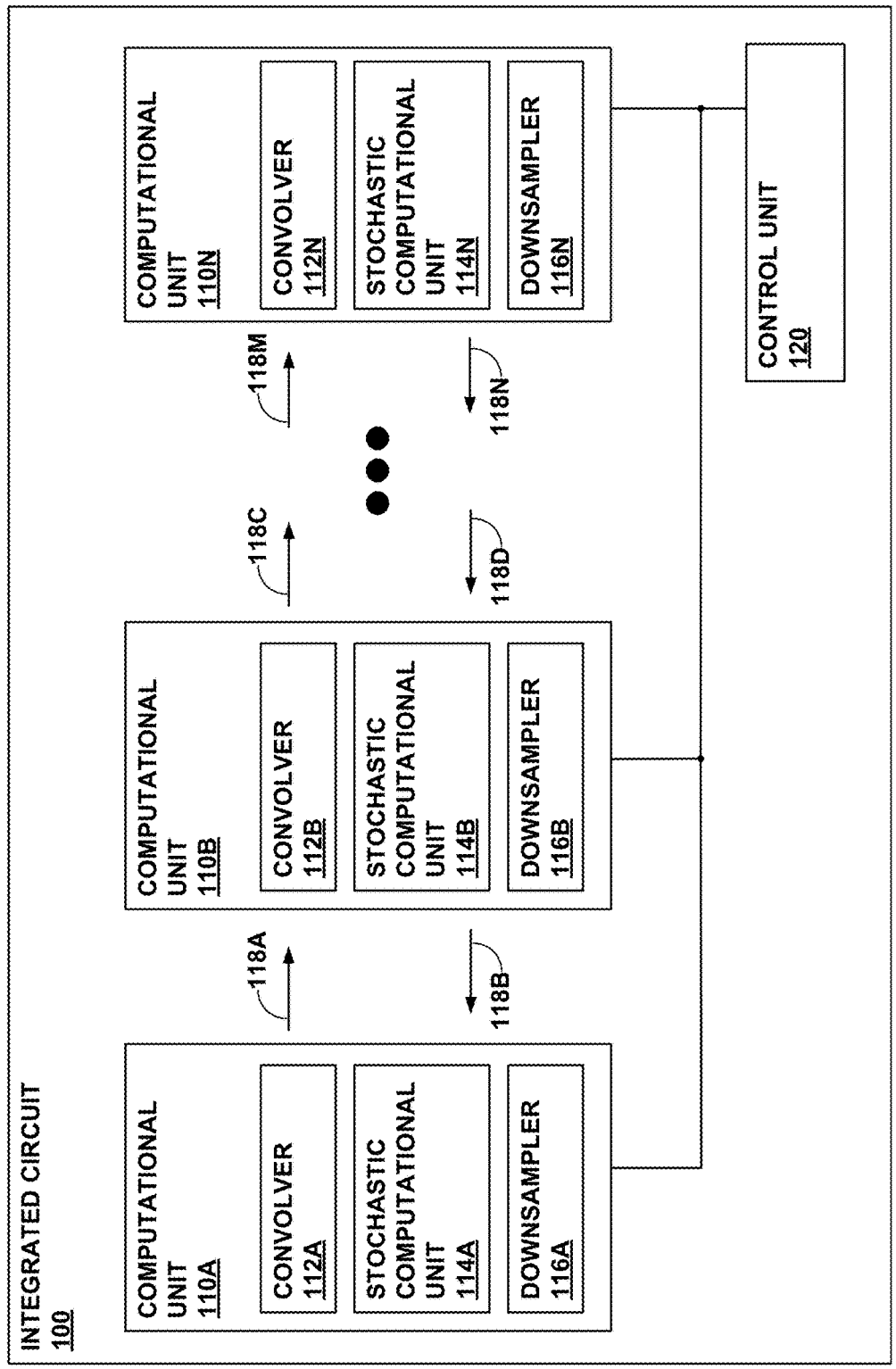
FIG. 1 illustrates an integrated circuit with computational units, in accordance with some examples of this disclosure, in some examples of this disclosure.

FIG. 1 illustrates an integrated circuit 100 with one or more computational units 110A-110N, in accordance with some examples of this disclosure. In this example, each computational unit 110 represents a functional component, e.g., processing module, designed to perform operations, such as arithmetic operations, image processing, signal processing, and the like.

As shown in the example of FIG. 1, computational units 110 exchange data via bit streams 118A-118N. For example, computational unit 110A may output stochastic bit stream 118A to computational unit 110B, where it may serve as an input bit stream carrying operands representing numerical values. Computational unit 110B may utilize deterministic bit streams 118A and 118D as inputs and may generate deterministic bit streams 118B and 118C as outputs. In general, each computational unit 110 may receive multiple deterministic bit streams 118 as input bit streams and produce one or more output bit streams indicative of the results of the operations.

In general, deterministic bit streams 118 use a set of zeroes and ones to express a fractional number between zero and one. For examples, a bit stream carrying a ten-bit sequence of 1, 1, 1, 0, 0, 0, 0, 0, 0, 0 may represent the value three-tenths because thirty percent of the bits are one. The percentage of ones and zeroes may be one form of deterministic encoding to represent the numerical value thirty percent or three tenths because the probability that any data bit of the bit stream is high may be equal to the numerical value. Thus, for any set of N bits, the probability that any bit in the set of bits is one corresponds to the value represented by that set of bits in the deterministic bit stream.

In some examples, stochastic computational unit 114B may be configured to process bit streams 118A and 118D sequentially or in parallel. Computational unit 110B may be configured to process input bit streams sequentially by feeding each of the input bit streams "single file" into stochastic computational unit 114B. Computational unit 110B may be configured to process input bit streams in parallel by splitting each of the input bit streams into two or more input bit streams and feeding the split input bit streams into two or more respective, parallel stochastic computational units. In some examples, sequential processing may include fewer stochastic computational units and therefore consume less chip space, as compared to parallel processing. In some examples, parallel processing may be quicker, as compared to sequential processing.

In this manner, deterministic bit streams 118 are similar to bit streams used in stochastic processing circuits in that numerical data values are represented by a probability that any bit in the respective set of data bits is high. However, as described herein, unlike conventional stochastic processing circuits that operate on bit streams in which individual bit values are random or pseudo-randomly generated, deterministic bit streams 118 are generated using a deterministic, i.e., known or repeatable, encoding scheme. Furthermore, techniques are described herein by which deterministic bit streams 118 are pre-processed by computational unit 110 so that each of the computational units may nevertheless operate on the bit streams using stochastic computational units 114 even though the bit streams are not random or pseudo random in nature, which would otherwise be a requirement for stochastic computational circuits to function correctly.

As shown in FIG. 1, each of computational units 110A-110N includes a convolver 112A-112N, a stochastic computational unit 114A-114N, and, in some examples, a downsampler 116A-116N. Each of computational units 110A-110N may also include more than one stochastic computational unit 114 or other submodules not shown in FIG. 1.

As described herein, each of convolvers 112 operates to pre-process deterministic bit streams 118 so as to ensure correct arithmetic operations are performed by stochastic computational units 114 even though bit patterns within bit streams 118 are not random or pseudorandom in nature. As described herein, each of convolvers 112 may receive two or more input deterministic bit streams 118 and effectively performs convolution on the bit streams to generate pairwise combinations of the data bits of the bit streams for subsequent processing by stochastic computational units 114. In this way, each bit within a first input bit stream carrying an input operand may effectively be applied to or otherwise considered in conjunction with each bit of a second input bit stream, thereby overcoming any non-random characteristics in the manner in which the operands are encoded.

For full convolution, the convolved bit streams may have lengths equal to the product of the lengths of the input bit streams. For example, if there are two input bit streams, each with a length of one thousand bits, the convolved bit stream may have a length of one million bits. In some examples, to reduce the length of the convolved bit streams, convolvers 112 may be configured to cease convolution after reaching a threshold number of bits within the output stream.

Moreover, convolvers 112 need not necessarily convolve all bits of an operand of the first bit stream with all bits of an operand of the second bit stream so as to balance precision or accuracy with bit depth and circuit complexity. In some example implementations, convolvers 112 may be configured to perform convolution on deterministic bit streams 118 by processing a threshold number (i.e., subset) of the bits of deterministic bit streams 118 to produce less than all of the pairwise combinations of the bit streams. Processing a threshold number of bits to produce less than all the pairwise combinations may reduce the time and resources for processing deterministic bit streams 118 and reduce the length of the output bit stream with a tradeoff of precision and accuracy.

Convolvers 112 may perform convolution on deterministic bit streams 118 by one of several methods described herein. In the relatively prime method, each of two deterministic bit streams 118 may have lengths that are relatively prime (e.g., lengths of four and five). In the relatively prime method, convolvers 112 may iterate through one of the deterministic bit streams 118 until each bit, or a threshold number of bits, of a first deterministic bit stream 118 has been paired with the bits of a second deterministic bit stream 118 and processed by stochastic computational units 114.

In the rotation method of convolution, convolvers 112 may iterate through one of the deterministic bit streams 118 while rotating a different one the respective deterministic bit streams 118 when generating the bit pairs. In some examples of the rotation method, a second deterministic bit stream 118 may start on a second bit for the second cycle, a third bit for the third cycle, and so on. In the clock division method of convolution, convolvers 112 may hold a first bit of a first deterministic bit stream 118 while pairing all or a threshold subset of bits of a second deterministic bit stream 118 to the first bit. In the clock division method, convolvers may then run a second bit of the first deterministic bit stream 118, while pairing all or a threshold subset of bits of a second deterministic bit stream 118 to the second bit.

In this way, input deterministic bit streams 118 are processed by convolvers such that stochastic computational units 114 are capable of accurately performing arithmetic operations using stochastic logic circuits. That is, stochastic computational units 114 may be any logic gates or circuits designed to perform computations on input bit streams that would normally represent numerical values by probabilities within sequences of random bits. As will be understood, as stochastic computational units, otherwise complex operations can be performed by high-speed, less complex circuitry, as compared to traditional binary logic operations. Moreover, using the techniques described herein, bit streams 118 need not be random or pseudorandom in nature yet the functionality and advantages of stochastic computational units 114 can nevertheless be leveraged without loss of accuracy. As such, stochastic computational units 114 may be any stochastic computational units that can process stochastic, or random or pseudo-random, bit streams. Stochastic computational units 114 may include logic gates, memory units, multiplexers, or other devices that process input information and generate output information. Stochastic computational units 114 may generate and output deterministic bit streams 118 to other computational units 110.

In some example implementations, each computational unit 110 further includes a downsampler 116 configured to reduce the lengths of any output bit streams. In general, output bit streams may have lengths that are much longer than the input bit streams, and such length may be further increased due to the convolution techniques described herein. To reduce the length of bit streams, downsamplers 116 may sample the bit streams by removing bits. In some examples, downsamplers 116 may remove every other bit from a bit stream to reduce the length of the bit stream by fifty percent.

In general, control unit 120 controls operations of computational units 110 including delivery of deterministic bit streams 118 to and from computational units 110. For example, control unit 120 may be responsible for directing traffic among deterministic bit streams 118. Each of computational unit 110 may be driven by a locally or internally-generated clock or by a global clock for some or all of integrated circuit 100.

The techniques described herein may provide numerous advantages. Computation with deterministic bit streams 118 may be feasible with shorter bit-stream lengths, as compared to computation with stochastic bit streams that must be generated with random or pseudorandom bit patterns. Further, bit stream generation circuitry for generating deterministic bit streams may be considerably less complex. As such, computational units 110 may occupy less space within integrated circuit 100, as compared to stochastic computational units performing computation on stochastic bit streams.

When logical computation is performed on stochastic bit streams, there are two possible coding formats: a unipolar format and a bipolar format. These two formats are conceptually similar and can coexist in a single system. In the unipolar coding format, a real number x in the unit interval (i.e., $0 \leq x \leq 1$) corresponds to a bit stream $X(t)$ of length L, where $t=1, 2, \ldots, L$. The probability that each bit in the stream is one is $P(X=1)=x$. For example, the value $x=0.3$ could be represented by a random stream of data bits such as 0100010100, where 30% of the data bits are one and the remainder are zero. In the bipolar coding format, the range of a real number x is extended to $-1 \leq x \leq 1$. The probability that each bit in the stream is one is $$P(X=1) = \frac{x+1}{2}.$$

An advantage of the bipolar format is that it can deal with negative numbers directly. However, given the same bit stream length, L, the precision of the unipolar format is twice that of the bipolar format. This disclosure, unless stated otherwise, will use the unipolar format.

Figure 2A:
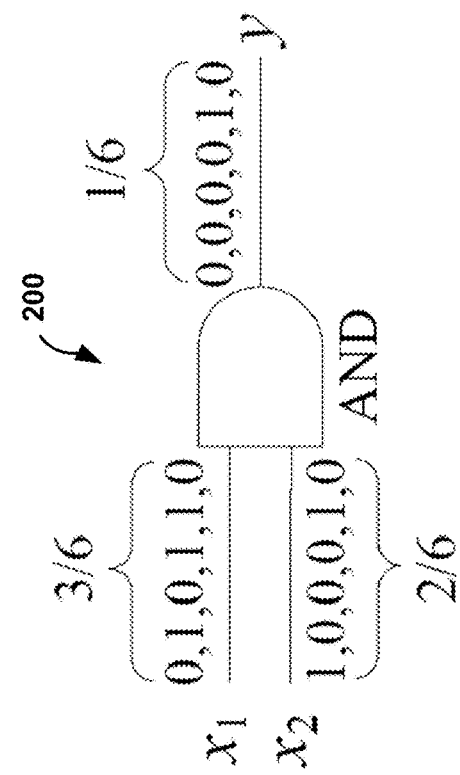
FIGS. 2A and 2B illustrate stochastic implementations of arithmetic operations including multiplication and scaled addition.
Figure 2B:
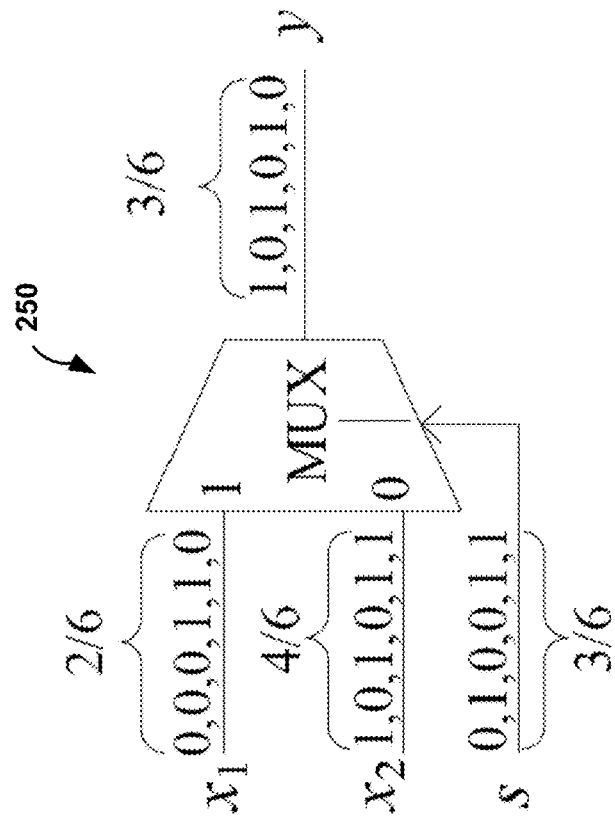

FIGS. 2A and 2B illustrate stochastic implementations of arithmetic operations including multiplication and scaled addition. The synthesis strategy with stochastic computational logic may cast logical computations as arithmetic operations in terms of probabilities. Two simple arithmetic operations—multiplication and scaled addition—are illustrated in FIGS. 2A and 2B. FIG. 2A depicts two independent bit streams X1 and X2. Stochastic computational unit 200, depicted as an AND gate, may be configured to receive input bit streams X1 and X2. The output bit stream of stochastic computational unit 200 is a bit stream Y, the value of which is defined by Equation (1).

$$y=P(Y=1)=P(X_1=1 \text{ and } X_2=1)=P(X_1=1)P(X_2=1)=x_1 x_2 \quad (1)$$

Thus, the AND gate in FIG. 2A computes the product of the two input probability values. FIG. 2B depicts a two-input multiplexer 250 (i.e., stochastic computational unit 250) configured to receive two input bit streams (e.g., independent stochastic bit streams X1 and X2), and its selecting input is a stochastic bit stream S. The output bit stream of stochastic computational unit 250 is a bit stream Y, the value of which is defined by Equation (2).

$$y = \quad (2)$$
$$P(Y=1) = P(S=1)P(X_1=1) + P(S=0)P(X_2=1) = sx_1 + (1-s)x_2$$

In some examples, multiplication and addition may represent arithmetic operations, not necessarily Boolean AND and OR. Thus, multiplexer 250 may compute the scaled addition of the two input probability values X1 and X2.

There may be two intuitive explanations of why stochastic computation works: computing on averages and discrete convolution. Stochastic computation may be framed as computation on probabilities, which may be an abstraction of what is happening at the data bit level. Computation may occur in a statistical sense on the average number of ones and zeros in the input bit streams. Because the probability represented by a bit stream is equivalent to its expected value, the value represented by the input bit streams may be based on the number of ones and zeros expected on average. For example, bit stream A may represents a probability $p_A=2/3$, which may be equivalent to saying that two ones are expected for every three bits. In general, the number formats (unipolar, bipolar, etc.) may be defined in terms of the average number of ones and zeros. For example, the probability p of unipolar and bipolar bit streams may be defined by Equations (3a, 3b), where $N_1$ and $N_0$ are the average number of ones and zeros.

$$P_{uni} = \frac{N_1}{N_1 + N_0} \quad P_{bi} = \frac{N_1 - N_0}{N_1 + N_0} \quad (3a, 3b)$$

Therefore, by showing how each logic gate manipulates the average number of ones and zeros, the operation of the logic gate or stochastic computational unit can be expressed independently of any particular number format. Using two independent input bit streams in a unipolar format, an AND gate multiplies their probabilities. Labeling the input bit streams as A and B, the probability of the output bit stream C is given by Equation (4), including multiplying out the right side of the Equation (4) and organizing the terms. $N_{C1}$ and $N_{C0}$ represent the average number of ones and zeros in bit stream C.

$$P_C = P_A P_B = \frac{N_{C1}}{N_{C1} + N_{C0}} = \frac{N_{A1}}{N_{A1} + N_{A0}} \frac{N_{B1}}{N_{B1} + N_{B0}} = \quad (4)$$
$$\frac{N_{A1} N_{B1}}{N_{A1} N_{B1} + (N_{A1} N_{B0} + N_{A0} N_{B1} + N_{A0} N_{B0})}$$

The fraction may have the same form as the unipolar probability of Equation (3). Therefore, the average number of ones and zeros in bit stream C can be written in terms of the average number of ones and zeros in bit streams A and B, as shown in Equations (5a, 5b).

$$N_{C1}=N_{A1}N_{B1} \; N_{C0}=N_{A1}N_{B0}+N_e e_{B1}+N_{A0}N_{B0} \quad (5a, 5b)$$

Denote the average number of ones and zeros in a bit stream X as the uniform number $N_{X1}\{1\}+N_{X0}\{0\}$. Distributing the AND operation (denoted by $\wedge$) may give the same result, as shown in Equation (6).

$$N_{C1}\{1\}+N_{C0}\{0\}=(N_{A1}\{1\}+N_{A0}\{0\}) \wedge (N_{B1}\{1\}+$$
$$N_{B0}\{0\})=N_{A1}N_{B1}\{1\}+(N_{A1}N_{B0}+N_{A0}N_{B1}+$$
$$N_{A0}N_{B0}\{0\} \quad (6)$$

Equation (6) shows that, by representing probabilities with independent random bit streams, an AND gate operates on average proportions of ones and zeros. In general, for any arbitrary logic gate (e.g., a stochastic computational unit) with independent random bit streams A and B as inputs, the proportion of data bits at the output may be given by Equation (7).

$$N_{C1}\{1\}+N_{C0}\{0\}=(N_{A1}\{1\}+N_{A0}\{0\})\square(N_{B1}\{1\}+N_{B0}\{0\}) \quad (7)$$

where the $\square$ symbol is replaced with any Boolean operator. Equation (7) demonstrates that independent random bit streams may passively maintain the property that the average data bits of bit stream A are operated on with the average data bits of bit stream B. Due to the independence of the bit streams, each outcome of a bit stream (one or zero) may "see" the average number of ones and zeros of another bit stream. (Of course, if the bit streams are correlated, the output may not necessarily depend on the proportions of the bit streams in a straightforward way.)

In a first example, a stochastic computational unit may be configured to receive two independent bit streams A and B with unipolar probabilities $p_A=1/3$ and $p_B=2/3$. This means that, on average, a single one will occur for every three bits of A and two ones will occur every three bits of B. If these bit streams are used as inputs to an AND gate, the average output and probability are given by Equations (8a, 8b).

$$N_{C1}\{1\} + N_{C0}\{0\} = (1\{1\} + 2\{0\}) \wedge (2\{1\} + 1\{0\}) = \quad (8a)$$
$$(2\{1 \wedge 1\} + 1\{1 \wedge 0\}) + 4\{0 \wedge 1\} + 2\{0 \wedge 0\} = 2\{1\} + 7\{0\}$$

$$p_C = \frac{2}{2+7} = \frac{2}{9} \quad (8b)$$

In a second example, a stochastic computational unit may be configured to receive two independent bit streams A and B with bipolar probabilities $p_A=4/6$ and $p_B=3/5$. This means that, on average, five ones will occur for every six bits of A and a single one will occur for every five bits of B. If these input bit streams are used as inputs to an XNOR gate, the average output and probability are given by Equations (9a, 9b).

$$N_{C1}\{1\} + N_{C0}\{0\} = (5\{1\} + 1\{0\}) \equiv (1\{1\} + 4\{0\}) = \quad (9a)$$
$$5\{1 \equiv 1\} + 20\{1 \equiv 0\} + 1\{0 \equiv 1\} + 4\{0 \equiv 0\} = 9\{1\} + 21\{0\}$$

$$p_C = \frac{9-21}{30} = -\frac{12}{30} \quad (9b)$$

The first and second examples demonstrate that the output of a stochastic logic gate can be expressed by an average view of the random input bit streams and applying Equation (7). In basic terms, convolution consists of three operations: slide, multiply, and sum. For bit streams X and Y, each with L bits, the discrete convolution operation may be expressed by Equation (10).

$$\Sigma_{i=1}^{L}\Sigma_{j=1}^{L}X_iY_j \quad (10)$$

An AND gate may multiply proportions if each data bit of one input bit stream "sees" every data bit of the other input bit stream. This operation may be equivalent to sliding one operand past the other. In a third example, the following five-bit operands may slide past each other so that each data bit of the top operand sees two ones and three zeros and each data bit of the bottom operand sees three ones and two zeros. In this way, a stochastic representation maintains the sliding of average bit streams.

11100
01100→

A significant attribute of the stochastic representation may be that it is a uniform encoding. Uniform numbers have the interesting property that the order of elements does not matter (i.e., the values are not weighted). This means partial products can be summed by simple concatenation. The fourth example demonstrates how this contrasts with binary multiplication.

In the fourth example, one or more stochastic computational units may multiply binary numbers by performing bitwise multiplication and summing the weighted partial products. The multiplication may take two operations, bitwise multiply and sum, to go from binary inputs to a binary output. In contrast, to multiply uniform numbers, the partial products may be concatenated. By performing bitwise multiplications sequentially in time or in parallel, concatenation may be performed passively, as shown below for binary and uniform encoding.

$$\left.\begin{array}{r}10 \\ \times 10 \\ \hline 00 \\ 10\end{array}\right\} \xrightarrow{\text{Binary}}_{\text{sum}} 100 \left.\begin{array}{r}10 \\ \times 10 \\ \hline 00 \\ 10\end{array}\right\} \xrightarrow{\text{Uniform}}_{\text{concatenate}} 1000$$

For uniform encoding, it may not be necessary to sum the output of a logic gate in a particular order to achieve the same representation as the inputs. The input bit streams and output bit streams may be defined in terms of "proportions in" and "proportions out". In contrast, a weighted encoding may result in additional circuitry to add the partial products in the correct manner.

The arithmetic logic of a stochastic representation may be relatively simple. The slide and sum operations of convolution may be passively provided by the representation. Stochastic computational units may perform convolution of proportions by logic operations that may result in bitwise (or element-wise) multiplication of the particular number format. Looking back at Example 2, we can think of the bipolar format as containing positive entities ('1's) and negative entities ('0's). Multiplication of entities that can be both positive and negative may be defined by the following truth tables in Tables I and II.

TABLE I

| a | b | a × b |
|---|---|-------|
| − | − | + |
| − | + | − |
| + | − | − |
| + | + | + |

TABLE II

| a | b | a ≡ b |
|---|---|-------|
| 0 | 0 | 1 |
| 0 | 1 | 0 |
| 1 | 0 | 0 |
| 1 | 1 | 1 |

Table II may be identical to the truth table implemented by an XNOR gate. Therefore, by using the logic gate that multiplies the format of the entities, the average bit streams may be convolved. Therefore, multiplication and scaled addition may be relatively simple operations with stochastic logic. Randomness may not be necessary because the process can be described as multiplying every bit of one proportion by every bit of another proportion, or equivalently, by sliding and multiplying deterministic numbers. In some examples, the stochastic deterministic approach described herein may reduce the cost and latency, as compared to the traditional stochastic method.

Equation (7) may provide a link between independent stochastic bit streams and deterministic bit streams. With stochastic computational units, independent stochastic bit streams may be substituted for deterministic bit streams if proportion A sees every bit of proportion B.

Figure 3A:
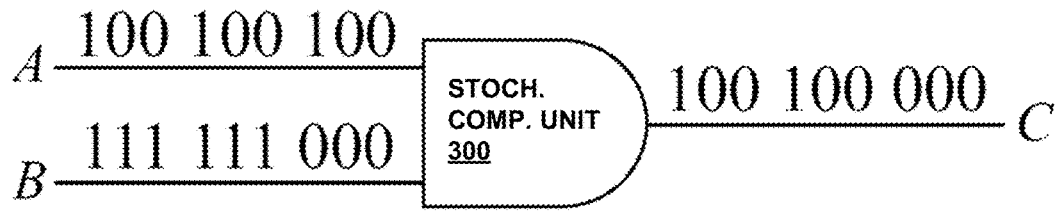
FIG. 3A illustrates multiplication by repeating a first input bit stream and by clock dividing a second input bit stream.

FIG. 3A illustrates multiplication by repeating a first input bit stream and by clock dividing a second input bit stream. In this fifth example, two registers may contain deterministic unipolar proportions $p_A=1/3$ and $p_B=2/3$. To use a single AND gate (i.e., stochastic computational unit 300) to perform multiplication, each data bit of $p_A$ may be ANDed with each data bit of $p_B$. Therefore, each bit stream may be a redundant encoding, such as clock dividing one proportion while the other repeats, as depicted in FIG. 3A.

Figure 3B:
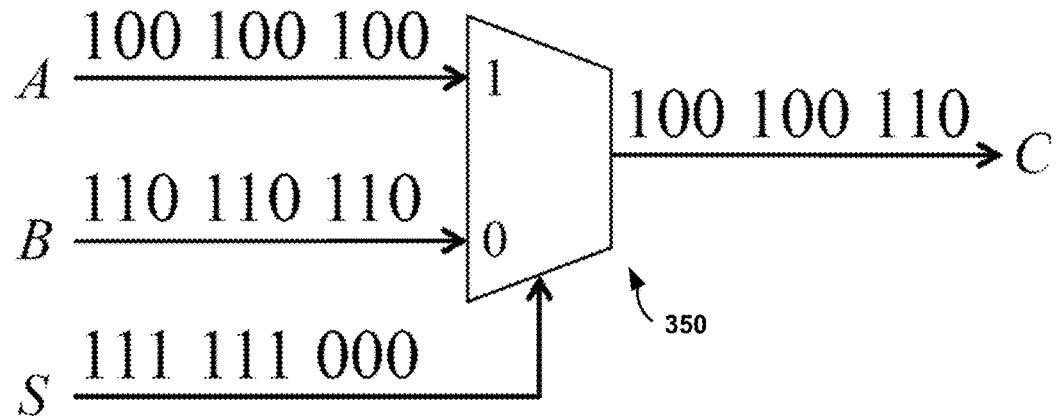
FIG. 3B illustrates scaled addition by repeating two input bit streams and clock dividing a selector input bit stream.

FIG. 3B illustrates scaled addition by repeating two input bit streams and clock dividing a selector input bit stream. In this sixth example, three registers contain deterministic unipolar proportions $p_A=1/3$, $p_B=2/3$, and $p_S=2/3$. A two-input multiplexer (i.e., stochastic computational unit 350) performs scaled addition by performing the logical operation $(S \land A) \lor (\neg S \land B)$, where $\land$ is AND, $\lor$ is OR, and $\neg$ is NOT. Stochastic computational unit 350 may include two AND gates, an inverter, and an OR gate. Because the circuit for stochastic computational unit 350 simply selects the output of either AND gate, bit streams A and B do not need to be independent from each other. Only bit stream S is required to be independent from A and B. Clock dividing S while A and B repeat performs scaled addition, as shown in FIG. 3B.

In these examples, Equation (7) is applied to deterministic bit streams. The term "independent" can describe both random and deterministic bit streams that obey Equation (7) 6.

A stochastic representation may passively maintain the property that each data bit of one proportion sees every data bit of the other proportion. This property may occur on average, meaning the input bit streams have to be much longer than the resolution the input bit streams represent due to random fluctuations. Equation (11) defines the input bit stream length N required to estimate the average proportion within an error margin ε.

$$N > \frac{p(1-p)}{\varepsilon^2} \quad (11)$$

To represent a value within a binary resolution $1/2^n$, the error margin ε may equal $1/2^{n+1}$. Therefore, the input bit stream may be greater than $2^{2n}$ uniform bits long, as the $p(1-p)$ term is at most equal to $2^{-2}$. This means the length of a stochastic bit stream may increase exponentially with the desired resolution. To represent values as stochastic bit streams may result in enormously long bit streams. For example, to find the proportion of a random bit stream with 10-bit resolution ($1/2^{10}$), a stochastic bit stream may include at least $2^{20}$ data bits. This length is over a thousand times longer than the bit stream that may be used to represent the same value with a deterministic uniform representation. The computations on stochastic bit streams may also include from some level of correlation between bit streams. This correlation can cause the results to bias away from the correct answer. For these reasons, stochastic logic may be used to perform approximate computations to avoid longer bit stream length.

In some examples, LFSRs may be designed to be at least as long as the desired resolution in order to produce bit streams that are sufficiently random. A "Randomizer Unit" may use a comparator and LFSR to convert a binary encoded number into a random bit stream. Each independent random bit stream may be generated by a unique generator. Therefore, circuits requiring i independent inputs with n-bit resolution may include i LFSRs with length L approximately equal to 2n. This may result in the LFSRs dominating a majority of the circuit area for a stochastic circuit.

Deterministic bit streams may avoid the problems associated with randomness while retaining the computational benefits associated with a stochastic representation. For instance, the deterministic representation may retain the fault-tolerance properties attributed to a stochastic representation because the deterministic representation may also use a uniform encoding. To represent a value with resolution $1/2^n$ in a deterministic representation, the bit stream may be $2^n$ data bits long. The computations with deterministic representations may be accurate because the computations may not suffer from correlation.

To utilize a deterministic representation, bit stream generators may operate in accordance with Equation (7). This disclosure describes three methods for generating independent deterministic bit streams and the associated circuit implementations. Without the stochastic characteristic of randomness, the hardware cost of the bit stream generators may be relatively small.

Figure 4:
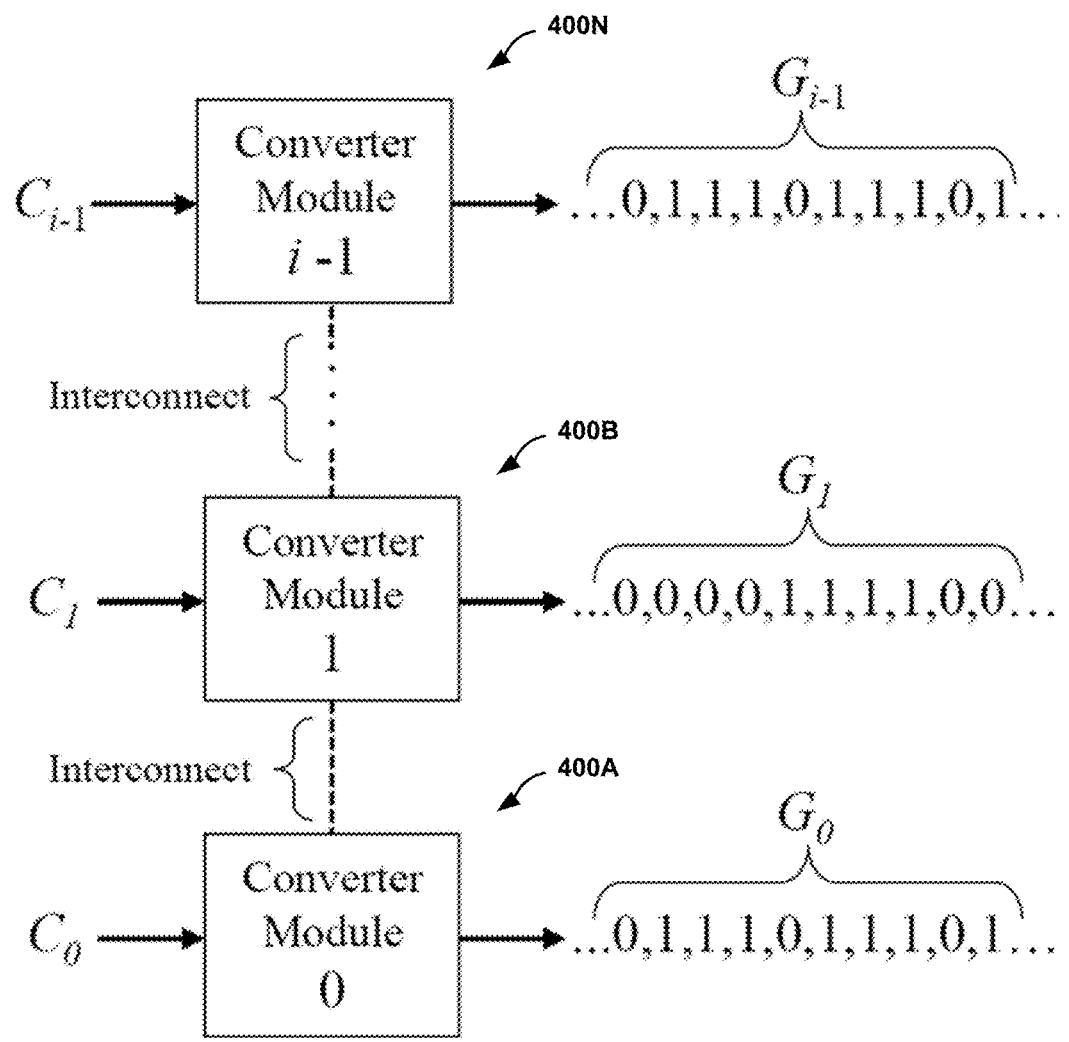
FIG. 4 illustrates a deterministic bit stream generator formed by an interconnection of converter modules.
Figure 5:
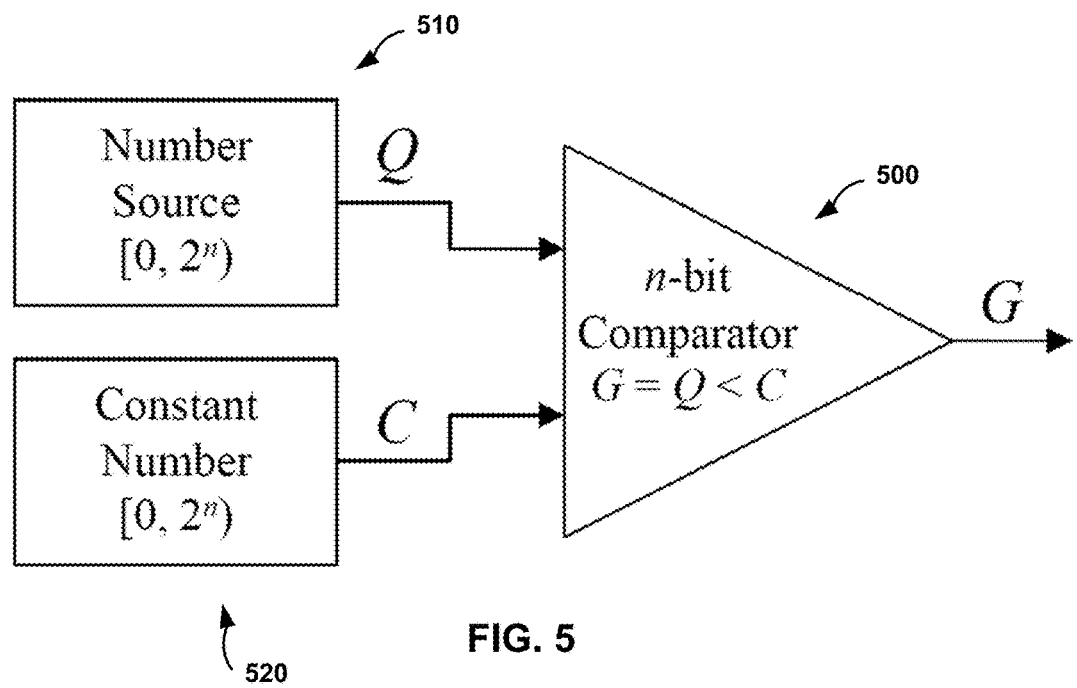
FIG. 5 illustrates a converter module circuit is configured to select bits from a collection or an array.
Figure 6:
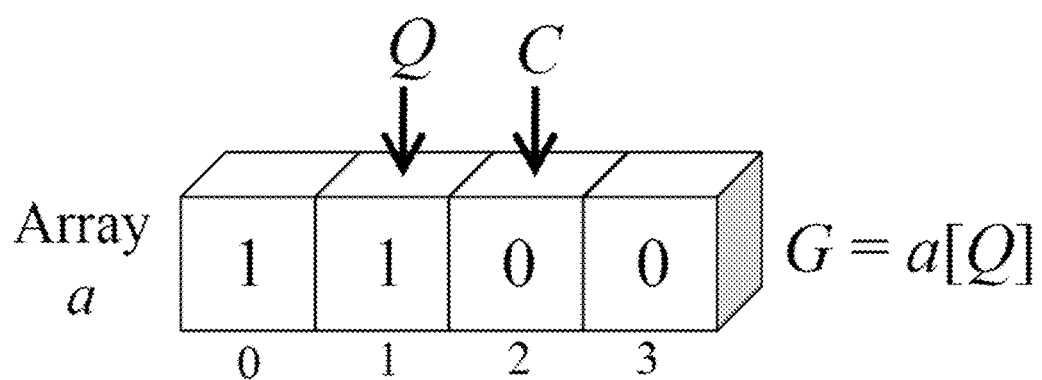
FIG. 6 illustrates an analogy of the circuit operation of FIG. 5, where the converter module circuit configured to select bits from a collection or an array.

FIG. 4 illustrates a deterministic bit stream generator formed by an interconnection of converter modules 400A-400N. FIG. 5 illustrates a converter module circuit (e.g., comparator 500) configured to select bits from a collection or an array, as shown in FIG. 6. Each of the three methods may be implemented using a bit stream generator formed by a group or interconnection of converter modules (e.g., converter modules 400A-400N), as shown in FIG. 4. Each of converter modules 400A-400N may use the general circuit topology of FIG. 5. The converter modules 400A-400N may be similar to the "Randomizer Unit" of stochastic circuits. One difference may be that the LFSR in stochastic generators is replaced by a deterministic number source. Comparator 500 may be configured to generate a high value when the constant number C is greater than number Q and to generate a low value when the constant number C is less than number Q. The generator may receive operands and generates bit streams in a manner shown in Equation (12).

$$G(C_0, C_1, \ldots, C_{i-1}) \rightarrow (C_0\{1\} + (2^{n_0} - C_0)\{0\}) \square (C_1\{1\} + (2^{n_1} - C_1)\{0\}) \square \ldots \square (C_{i-1}\{1\} + (2^{n_{i-1}} - C_{i-1})\{0\}) \quad (12)$$

The number i is total number of converter modules that make up the generator, $n_i$ is the binary resolution of the ith individual module, $C_i$ is an operand defining the proportion (or encoded value) of the bit stream, and each $\square$ can be any arbitrary logical operator, such as an AND operator, an OR operator, and/or a NAND operator.

FIG. 6 illustrates an analogy of the circuit operation of FIG. 5, where the converter module circuit is configured to select bits from a collection or an array. The converter module circuit of FIG. 5 may be analogous to selecting bits from a collection or array a, as shown in FIG. 6. The binary constant C may determine the contents of the array: any elements less than index C contain a one, otherwise they contain a zero. In this way, C may define a uniform proportion of ones and zeros: $C \rightarrow C\{1\}+(2^n-C)\{0\}$. The array may represent a proportion as a sequence of data bits: $a_0, a_1, \ldots a_{2^n-1}$. The number Q, determined by the deterministic number source, may point to different indices of the array. Each clock cycle, the element to which Q points may be chosen as the next output. To ensure the generated bit stream has the same proportion of ones and zeros (i.e., represents the number C), Q may point to each index an equal number of times (within some period). The input C may define the proportion or collection of bits from which the bit stream is uniformly generated. The sequence generated by the number source may be used to maintain the independence between bit streams. The converter modules may have certain properties relative to one another. Depending on the method used, these properties may manifest into either interconnections between converter modules or as differences in certain parameters between the converter modules.

The three methods maintain independence by using relatively prime bit lengths, rotation, or clock division. For each method, this disclosure describes the hardware complexity of the circuit implementation. In some examples, the computation time of each of the three methods may also be the same.

Figures 7, 8:
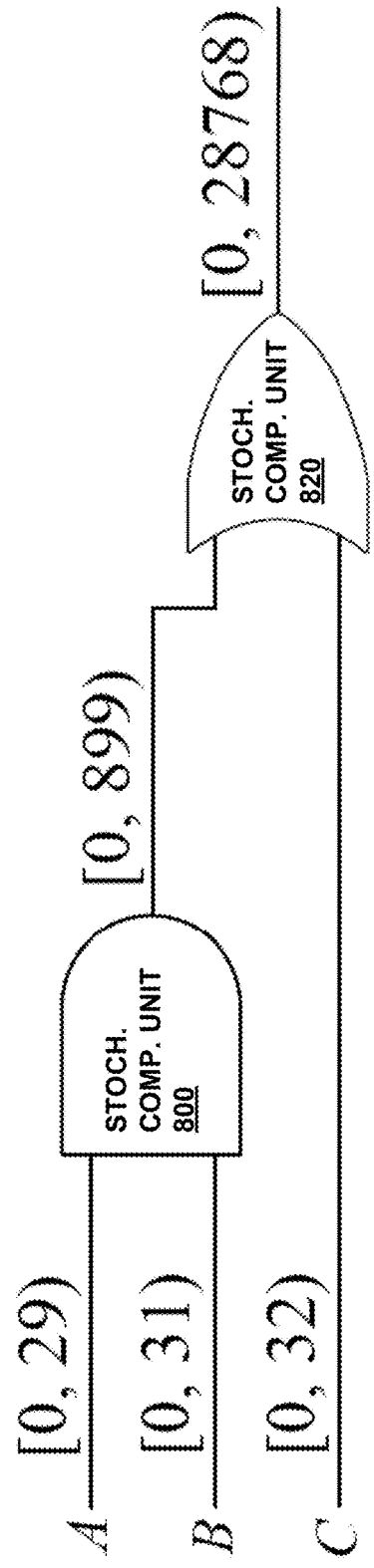
FIG. 7 illustrates two example bit streams generated by the relatively prime method.
FIG. 8 is an example of an arbitrary multi-level circuit with bit streams generated by the relatively prime method.

FIG. 7 illustrates two example bit streams (A and B) generated by the relatively prime method. The relatively prime method may maintain independence by using proportions that have relatively prime lengths (i.e., the ranges $[0, R_i)$ between converter modules are relatively prime). FIG. 7 demonstrates the method with two bit streams A and B, one with operand length four and the other with operand length three. The bit streams are shown in array notation to show the position of each bit in time. In FIG. 7, each row may represent an input bit stream, and each column may represent a pair-wise bit combination generated by a convolver using the relatively prime method.

FIG. 8 is an example of an arbitrary multi-level circuit with bit streams generated by the relatively prime method. The multi-level circuit may include stochastic computational units 800 and 820, which may include an AND gate and an OR gate in some examples. Independence between bit streams may be maintained because the remainder, or overlap between proportions, may result in a new rotation (or initial phase) of a proportion. This independence may occur because the input bit stream lengths share no common factors. This independence may also result in every bit of each operand seeing every bit of the other operand. For example, $a_0$ sees $b_0$, $b_1$ and $b_2$; $b_0$ sees $a_0$, $a_3$, $a_2$, and $a_1$; and so on. Using two input bit streams with relatively prime bit lengths j and k, the output of a logic gate may repeat with period jk. With multi-level circuits, the output of the logic gates may also be relatively prime. FIG. 8 demonstrates this concept with a two-level circuit. Therefore, by using relatively prime bit lengths up front, we can guarantee that Equation (7) is maintained for subsequent levels. In some examples, stochastic deterministic representations the same arithmetic logic as a stochastic representation.

Figure 9:
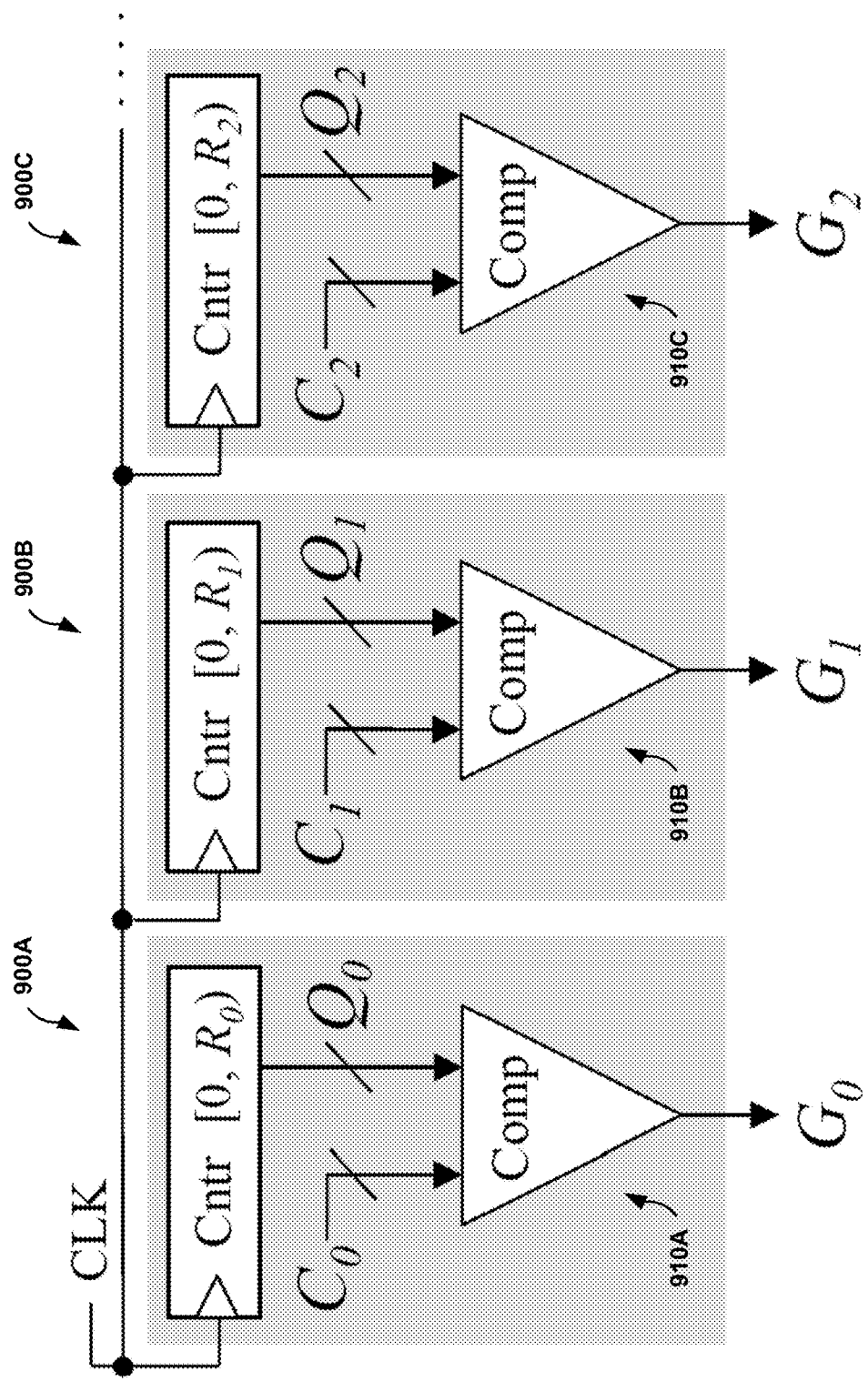
FIG. 9 illustrates an example circuit implementation of the relatively prime method.

FIG. 9 illustrates an example circuit implementation of the relatively prime method. Each converter module may use one of counters 900A-900C as a number source for iterating through each bit of the proportion. The state of the counter $Q_i$ may be compared by one of comparators 910A-910C with the proportion constant $C_i$. The relatively prime counter ranges $R_i$ between converter modules may maintain independence; there are no interconnections between modules. In terms of general circuit components, the circuit may use i counters and i comparators, where i is the number of generated independent bit streams. If the maximum range is a binary resolution $2^n$ and all of the converter modules are close to this value (i.e., 256, 255, 253, 251 . . . ), the circuit may contain approximately i n-bit counters 900A-900C and i n-bit comparators 910A-910C.

The relatively prime method may include the input bit streams with relatively prime lengths, which may be relatively long. The relatively prime method may also work well with an analog interpretation of the input bit streams, where the value may be encoded as the fraction of time the signal is high and the independence property may be maintained by using relatively prime frequencies. An analog implementation can also benefit from a simplified clock distribution circuit.

FIG. 10 illustrates two example bit streams (A and B) generated by the rotation method. In contrast to the relatively prime method, the rotation method may allow proportions of arbitrary length to be used. Instead of relying on relatively prime bit lengths, the rotation method may explicit rotate the proportions of both bit streams. This method may include changing the sequence generated by the number source after the number source iterates through the entire range of the respective bit stream. For example, the generator may inhibit or stall a counter every $2^n$ clock cycles, where n is the length of the counter, as a simple way to generate a bit stream where the proportion rotates in time. FIG. 10 demonstrates this method with two bit streams, both with proportions of length four. Each column of FIG. 10 may be a pair-wise bit combination generated by a convolver. For example, the first pair-wise bit combination may be $a_0$ and $b_0$, the second pair may be $a_1$ and $b_1$, and so on.

FIG. 11 is an example of an arbitrary multi-level circuit with bit streams generated by the rotation method. By rotating bit stream B's proportion, each data bit of one input bit stream may see the other input bit stream's proportion. Assuming all proportions have the same length, the two-bit stream example may extend to work with multiple bit streams by inhibiting counters at powers of the operand length. This method may allow the operands to rotate relative to longer bit streams. In some examples, input bit stream A may not rotate, input bit stream B may rotate every $2^n$ clock cycles, and input bit stream C may rotate every $2^{2n}$ clock cycles. The resultant output bit stream AB of the AND gate (e.g., stochastic computational unit 1100) may repeat every $2^{2n}$ clock cycles and input bit stream C may rotate every $2^{2n}$ bits. Therefore input bit stream C rotates relative to the output bit stream AB, maintaining the rotation property for multi-level circuits. Stochastic computational unit 1120 may be configured to perform a computational operation, such as a logical OR operation, on input bit streams AB and C to produce bit stream AB|C that indicates a result of the computational operation.

Figure 12:
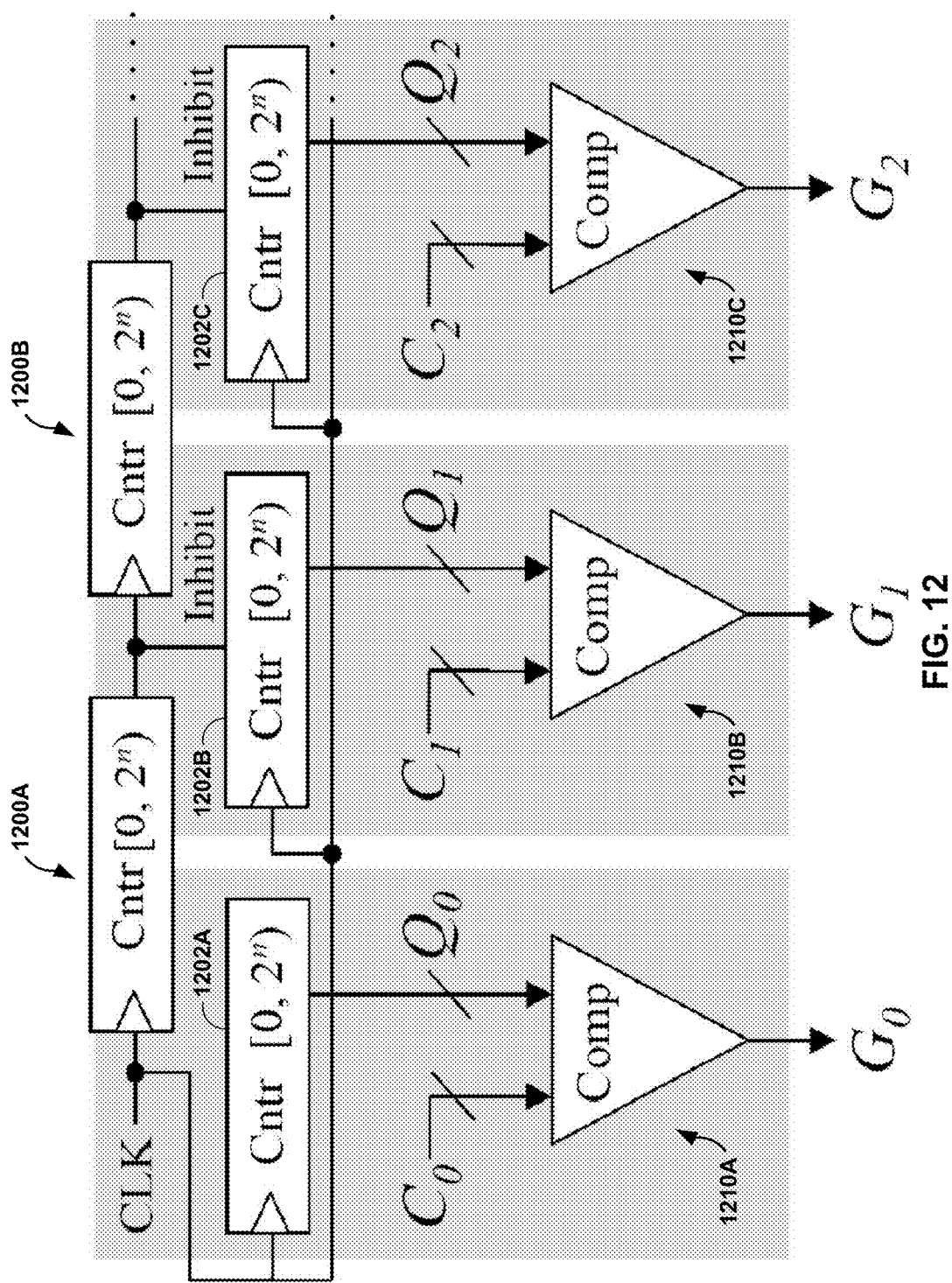
FIG. 12 illustrates an example circuit implementation of the rotation method.

FIG. 12 illustrates an example circuit implementation of the rotation method. The circuit of FIG. 12 may include counters 1200A, 1200B, 1202A-1202C and comparators 1210A-1210C. Comparators 1210A-1210C may be configured to generate any number of independent bit streams as long as the counter of every ith converter module is inhibited every $2^{ni}$ clock cycles. This can be managed by adding additional counters between each module. These counters may be configured to control the phase of each converter module and may be configured to maintain the property that each converter module rotates relative to the other modules. Using n-bit binary counters and comparators, the circuit requires i n-bit comparators and 2i−1 n-bit counters. One possible advantage of using rotation as a method for generating independent bit streams is that the operands may have the same resolution using more basic components than the relatively prime method.

Figure 13:
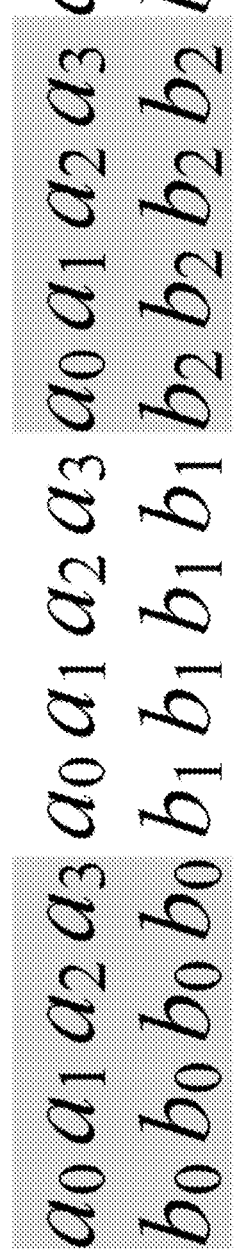
FIG. 13 illustrates two example bit streams generated by the clock division method.

FIG. 13 illustrates two example bit streams generated by the clock division method. The clock division method works by clock dividing operands. Similar to the rotation method, the clock division method may allow proportions of bit streams to have arbitrary lengths. The fifth example above included this method. FIG. 13 demonstrates this clock division method with two bit streams, both with proportions of length four. Bit stream B is clock divided by the length of bit stream A's proportion. Each column of FIG. 13 may be a pair-wise bit combination generated by a convolver. For example, the first pair-wise bit combination may be $a_0$ and $b_0$, the second pair may be $a_1$ and $b_0$, and so on.

Figure 14:
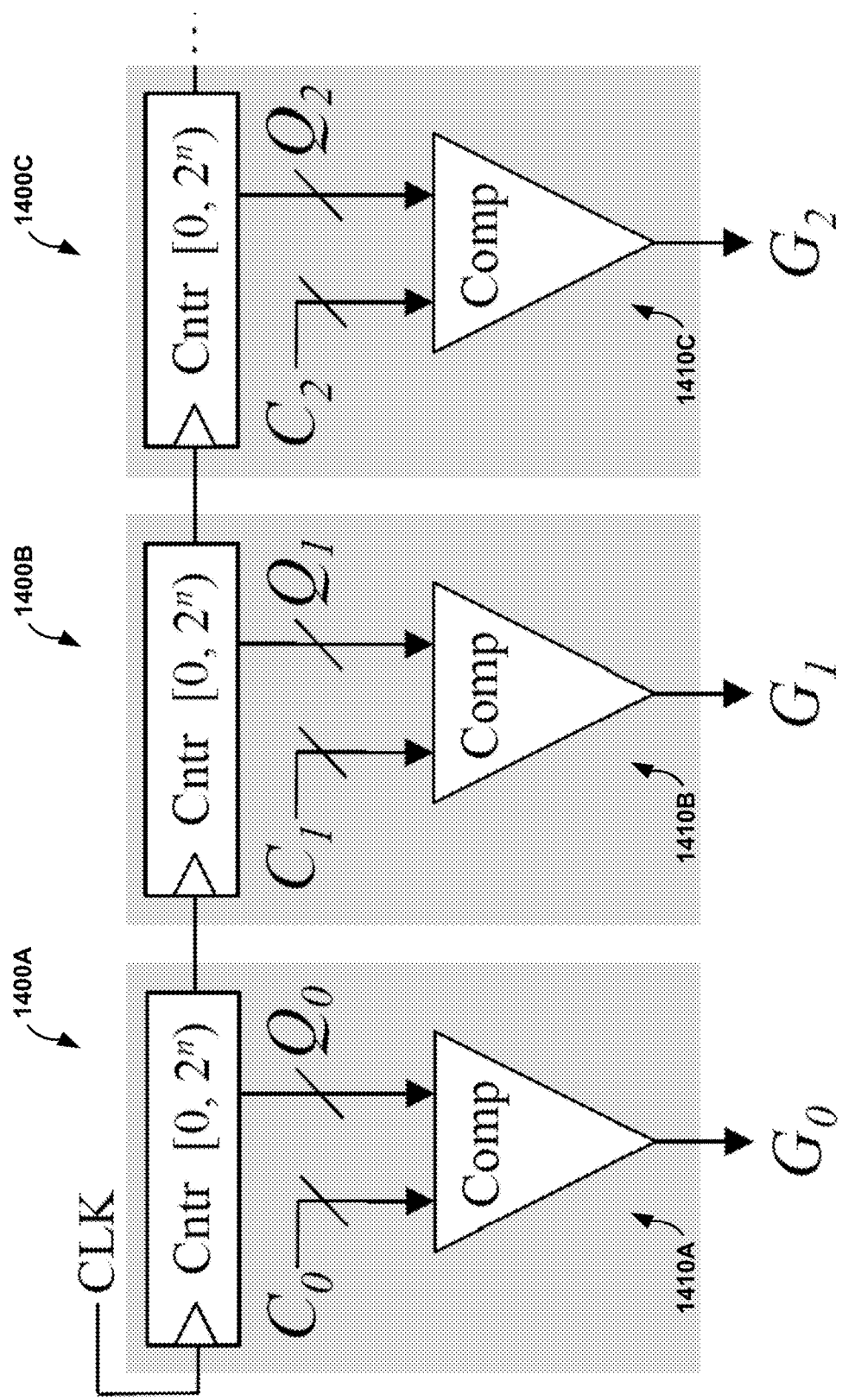
FIG. 14 illustrates an example circuit implementation of the clock division method.

FIG. 14 illustrates an example circuit implementation of the clock division method. The circuit implementation includes counters 1400A-1400C and comparators 1410A-1410C. Assuming all operands have the same length, the circuit can generate an arbitrary number of independent bit streams as long as the counter of every ith converter module increments every $2^{ni}$ clock cycles. This method can be implemented in circuit form by chaining the converter module counters 1400A-1400C together, as shown in FIG. 14. Using n-bit binary counters and comparators, the circuit may include i n-bit comparators and i n-bit counters. The clock division method may allow operands of the same length to be used with approximately the same hardware complexity as the relatively prime method.

The hardware complexity and latency of the three deterministic methods are compared below with conventional stochastic methods. The comparison also includes implementations using Bernstein polynomials, which may be a general method for synthesizing arbitrary functions, for both precise and approximate computations. Perfectly precise computations may include an output resolution that is at least equal to the product of the independent input resolutions. This concept is demonstrated in Equation (7), which includes precisely computing the output of a logic gate given two proportions, each data bit of one proportion must be operated on with every data bit of the other proportion. For example, with proportions of size n and m, the precise output contains nm data bits.

Assuming each independent input i has the same resolution $1/2_{n_{in}}$, the output resolution may be given by $1/2_{n_{out}} = 1/2_{n_{in}i}$. A stochastic representation may include bit streams that are $2^{2n}$ bits long to represent a value with $1/2_n$ precision. To ensure the generated bit streams are sufficiently random and independent, each LFSR may have at least as many states as the required output bit stream. Therefore, to compute with perfect precision each LFSR may have at least length $2n_{in}i$. In this way, the precision of the computation may be determined by LFSR length.

With the deterministic methods, the resolution n of each input i may be determined by the length of its converter module counter. The output resolution may be the product of the counter ranges. For example, with the clock division method, each converter module counter may be connected in series. With i inputs each with resolution n, the series connection may form a large counter with $2^{ni}$ states. The output resolution may not be determined by the length of each individual number source, but the concatenation may influence the output resolution. The clock division method may allow for a large reduction in circuit area compared to stochastic methods.

To compare the area of the circuits in terms of gates, for every cell of a comparator, there may be three gates. In addition, for each flip-flop of a counter or LFSR, there may be six gates (e.g., the hardware complexity in terms of fanin, which may include two NAND gates). For i inputs with n-bit binary resolution, the gate count for each basic component is given by Table III.

TABLE III

Gate counts for components.

| Component | Gate Count |
|---|---|
| Comparator | 3n |
| Counter | 6n |
| LFSR | 12n |

Using the basic component totals for each deterministic method and the fact that each "Randomizer unit" may include one comparator and one LFSR per input, Table IV shows the total gate count and bit stream length for precise computations in terms of independent inputs i with resolution n.

TABLE IV

Gate counts and latency for methods.

| Representation | Method | Gate Count | Latency |
|---|---|---|---|
| Stochastic | Randomizer | $12ni^2 + 3ni$ | $2^{2ni}$ |
| Deterministic | Relatively Prime | 9ni | $2^{ni}$ |
| | Rotation | 15ni − 6n | |
| | Clock Division | 9ni | |

The equations of Table IV show that circuits implementing the deterministic methods may use less area and may compute to the same precision in exponentially less time. In addition, because the computations may not suffer from correlation, the computations may be completely accurate. Table V compares the gate count and latency of the conventional stochastic method with the clock division method using numerical values of i and n.

TABLE V

| | | Randomizer | | Clock Division | | Det. prod. |
|---|---|---|---|---|---|---|
| i | n | Gates | Latency | Gates | Latency | Stoch. prod. |
| 2 | 4-bit | 216 | $2^{16}$ | 72 | $2^8$ | $1.30 \times 10^{-3}$ |
|   | 8-bit | 432 | $2^{32}$ | 144 | $2^{16}$ | $5.09 \times 10^{-6}$ |
| 3 | 4-bit | 468 | $2^{24}$ | 108 | $2^{12}$ | $5.63 \times 10^{-5}$ |
|   | 8-bit | 936 | $2^{48}$ | 216 | $2^{24}$ | $1.38 \times 10^{-8}$ |
| 4 | 4-bit | 816 | $2^{32}$ | 144 | $2^{16}$ | $2.69 \times 10^{-6}$ |
|   | 8-bit | 1632 | $2^{64}$ | 288 | $2^{32}$ | $4.11 \times 10^{-11}$ |
| 5 | 4-bit | 1260 | $2^{40}$ | 180 | $2^{20}$ | $1.36 \times 10^{-7}$ |
|   | 8-bit | 2520 | $2^{80}$ | 360 | $2^{40}$ | $1.30 \times 10^{-13}$ |

For the given number of inputs i and resolution n, the clock divide method may have a 66-85% reduction in area and an exponential decrease in computation time. The deterministic area-delay product may be orders of magnitude smaller than the stochastic area-delay product.

Figure 15:
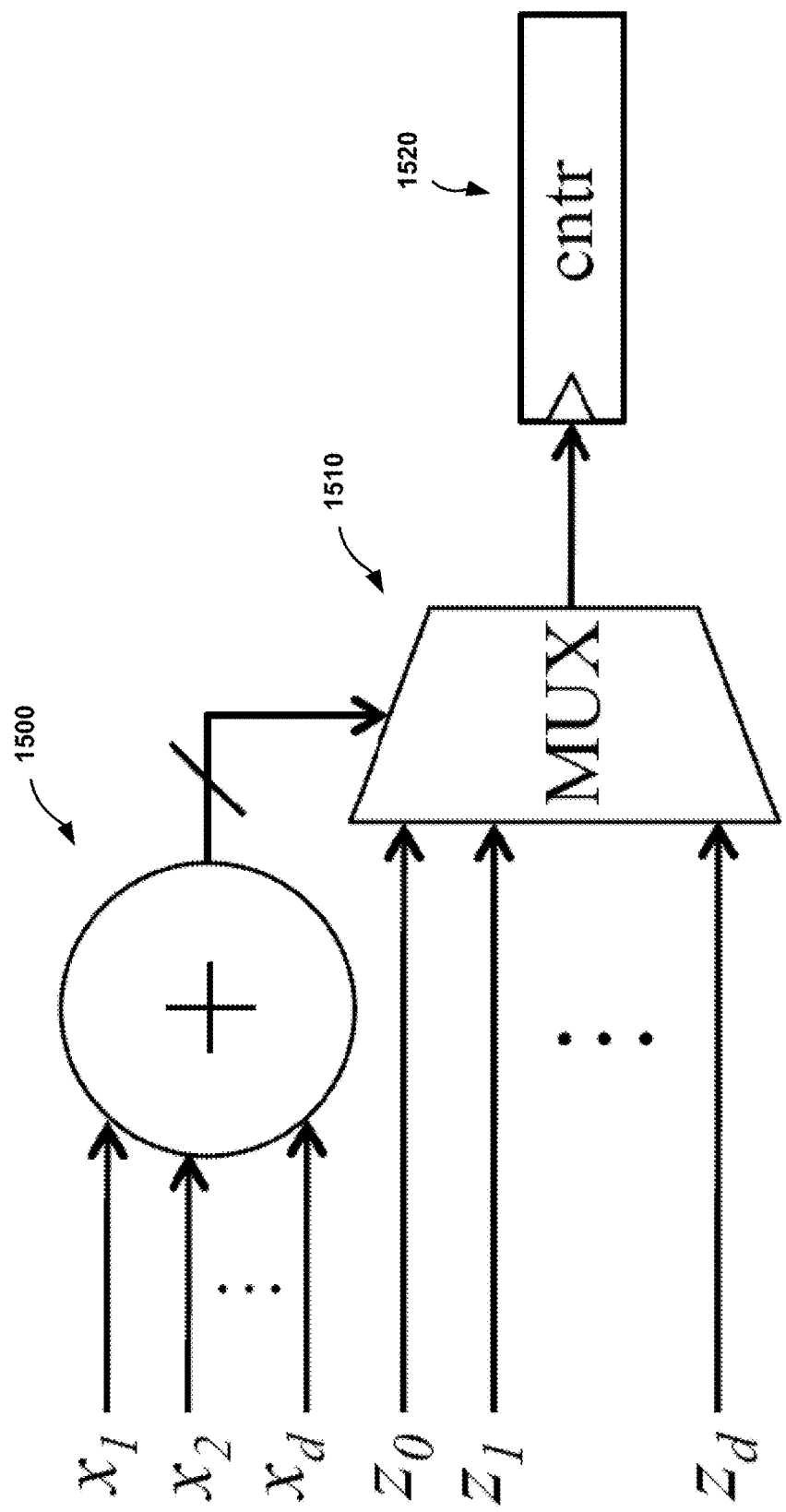
FIG. 15 illustrates an example circuit implementation of a Bernstein polynomial with an output counter.

FIG. 15 illustrates an example circuit implementation of the Bernstein polynomial with an output counter 1520. Implementations of Bernstein polynomials using stochastic and deterministic methods are compared below. A Bernstein polynomial can be used to synthesize power-form polynomial functions or approximate nonpolynomial functions that map values from the unit interval to values in the unit interval. Examples of Bernstein polynomials include $g(x)=6x^3-8x^2+3x$ and $f(x)=x^{0.45}$. This arithmetic circuit can be implemented using adder block 1500 and multiplexer block 1510, as shown in FIG. 15. Bit streams $z_i$ may form the coefficients of the Bernstein polynomial and input bit streams $x_i$ may form the input x.

For both representations, adder block 1500 may be formed by a d-bit adder made up of 2d gates and a (d+1)-channel multiplexer made with 3d gates. Each method may include the same number of bit streams and therefore may include 2d+1 comparators. Each of z bit stream may be independent from the input x bit streams but not necessarily independent from each other. This is because multiplexer 1510 may select only one z bit stream at a time. Therefore, Equation (7) does not necessarily have to be maintained between the coefficient bit streams and the same number source can be used for all z bit streams. Both methods may include d+1 number sources.

Using the above basic component counts and including output counter 1520, Table VI characterizes the hardware complexity and latency for implementing a Bernstein polynomial of degree d with n-bit binary input resolution. Table VII compares the clock division method to the stochastic method with numerical values of degree d and binary input resolution n.

TABLE VI

Bernstein Polynomial (degree d, n-bit input resolution)

| Generator | Gate Count | Latency |
| --- | --- | --- |
| Randomizer | $12nd^2 + 42nd + 27n + 5d$ | $2^{2n(d+1)}$ |
| Relatively Prime | $18nd + 15n + 5d$ | $2^{n(d+1)}$ |
| Rotation | $24nd + 15n + 5d$ | |
| Clock Division | $18nd + 15n + 5d$ | |

TABLE VII

| | | Randomizer | | Clock Division | | Det. prod. |
| --- | --- | --- | --- | --- | --- | --- |
| d | n | Gates | Latency | Gates | Latency | Stoch. prod. |
| 2 | 4-bit | 646 | $2^{24}$ | 214 | $2^{12}$ | $8.09 \times 10^{-5}$ |
| 3 | 4-bit | 1059 | $2^{32}$ | 291 | $2^{16}$ | $4.19 \times 10^{-6}$ |
| 4 | 4-bit | 1568 | $2^{40}$ | 368 | $2^{20}$ | $2.24 \times 10^{-7}$ |
| 5 | 4-bit | 2173 | $2^{48}$ | 445 | $2^{24}$ | $1.22 \times 10^{-8}$ |

With 4-bit binary inputs, the clock divide method may provide a 66-79% reduction in circuit area over the given range of polynomial degrees. The latency of the deterministic representation may be exponentially less than the stochastic representation. In some examples, the area-delay product of the clock divide method for computing Bernstein polynomials may be orders of magnitude less than the stochastic method. If a lower output resolution is desired to reduce the bit stream lengths, the resolution of the inputs can be relaxed according to Equation (12).

$$n_{in} = \lceil \frac{n_{out}}{i} \rceil = \lceil \frac{n_{out}}{d+1} \rceil \quad (12)$$

In general, stochastic computation may use imprecise output resolutions to avoid long delays and reduce the size of the LFSRs. By keeping the output resolution fixed, the LFSR lengths may be linearly proportional to d. Using an $n_{out}$-bit output resolution and relaxing the inputs, the hardware complexity for the stochastic method with a constant output resolution may be given by Equation (13). Table VIII compares the methods with constant output resolution, where the inputs of the deterministic methods may be relaxed according to Equation (12).

$$12n_{out}d + 24n_{out} + 6\lceil \frac{n_{out}}{d+1} \rceil d + 3\lceil \frac{n_{out}}{d+1} \rceil + 5d \quad (13)$$

TABLE VIII

| | | Randomizer | | Clock Division | | Det. prod. |
| --- | --- | --- | --- | --- | --- | --- |
| d | $n_{out}$ | Gates | Latency | Gates | Latency | Stoch. prod. |
| 3 | 8-bit | 537 | $2^{16}$ | 153 | $2^{8}$ | $1.11 \times 10^{-3}$ |
| 4 | 10-bit | 794 | $2^{20}$ | 194 | $2^{10}$ | $2.39 \times 10^{-4}$ |
| 5 | 12-bit | 1099 | $2^{24}$ | 235 | $2^{12}$ | $5.22 \times 10^{-5}$ |
| 6 | 14-bit | 1452 | $2^{28}$ | 276 | $2^{14}$ | $1.16 \times 10^{-5}$ |
| 7 | 16-bit | 1853 | $2^{32}$ | 317 | $2^{16}$ | $2.61 \times 10^{-5}$ |

The results of Table V may show that the clock divide method provides a 71 to 82% reduction in area for practical implementations of a Bernstein polynomial with constant output resolution.

The stochastic paradigm may permit complex arithmetic operations to be performed with remarkably simple logic, but the logic to generate pseudorandom bit streams may be costly, essentially offsetting the benefit. The long latency, poor precision, and random fluctuations may be near disastrous for most applications.

Randomness may be costly but not necessary for deterministic operations using stochastic computational units. Instead of relying upon statistical sampling to operate on bit streams, a convolver may be configured to slide one operand past the other, performing bitwise operations. The logic to perform this convolution may be less costly than that to generate pseudorandom bit streams. In addition, the stochastic deterministic approach may include much shorter bit streams to achieve the same accuracy as with statistical sampling through randomness. The results of computation with stochastic computational units on deterministic bit streams may be predictable and completely accurate.

Compared to a binary radix representation, stochastic deterministic representation may not be very compact. With M bits, a binary radix representation can represent distinct numbers. To represent real numbers with a resolution of $2^{-M}$, i.e., numbers of the form $$\frac{a}{2^M}$$

for integers a between 0 and $2^M$ may include a stream of $2^M$ bits. In contrast, a stochastic representation may include $2^{2M}$ bits to achieve the same precision. Even when randomness is free (for example, harvested from thermal noise or some other physical source) stochastic computing may include very high latency. In contrast, computation on deterministic uniform bit streams may be less costly, may have much lower latency, and may be completely accurate.

Figure 16:
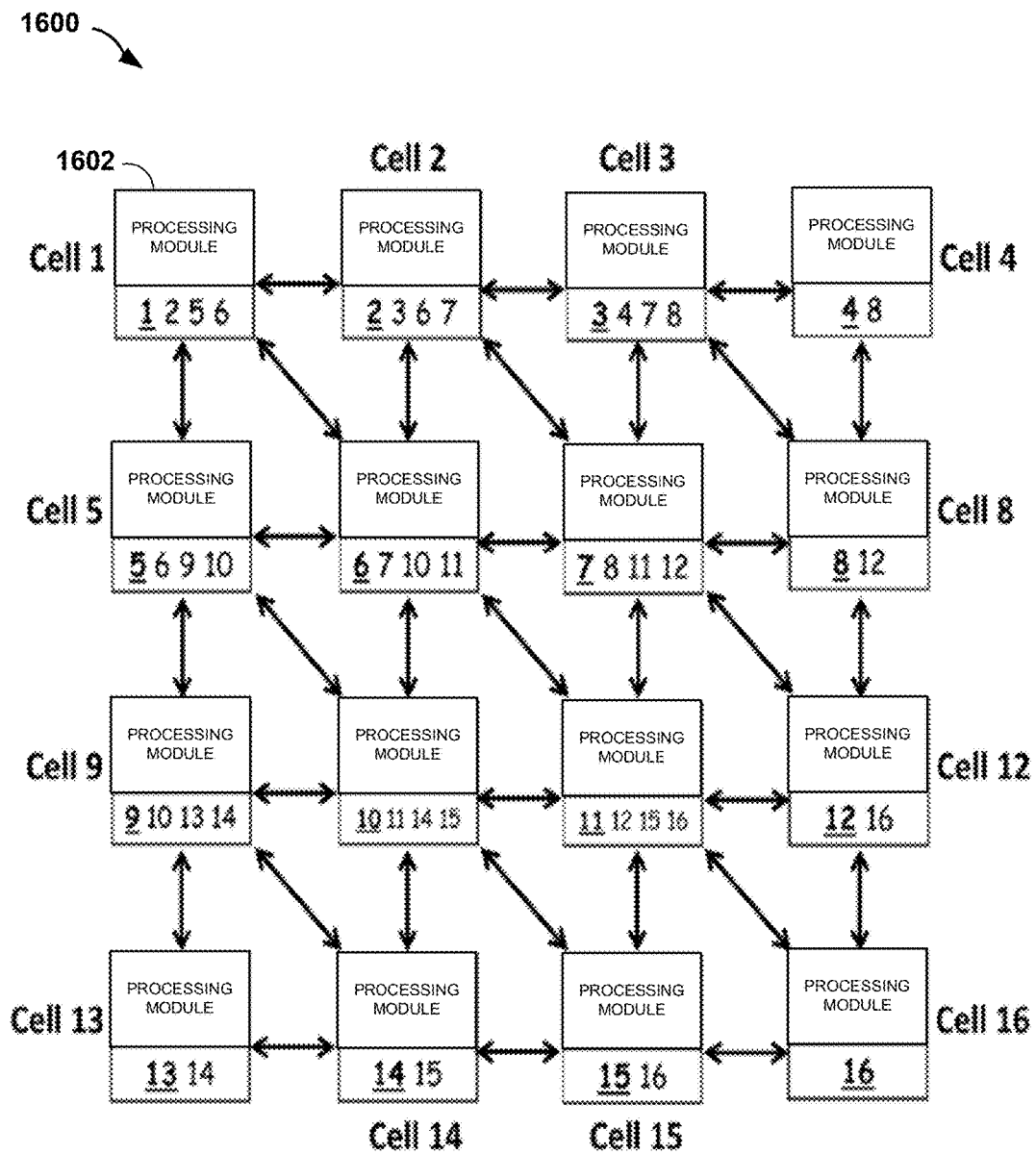
FIG. 16 illustrates sixteen Robert's Cross Cells processing a 4×4 input image concurrently, in some examples of this disclosure.

FIG. 16 illustrates sixteen Robert's Cross Cells processing a 4×4 input image concurrently, in some examples of this disclosure. FIG. 16 shows a diagram of parallel circuit 1600 illustrating one example application in which deterministic bit streams may be used in more complex integrated circuits, such as image processing circuits. In the example of FIG. 16, an input 4×4 gray-scale image can be processed by a Robert's Cross edge-detection circuit. An efficient way of processing the image may be to use 16 instances of the Robert's Cross circuit to process each of the pixels concurrently. Each cell may be a Robert's Cross cell that converts its input pixel value, presented as a deterministic bit stream, into an output pixel value, presented as deterministic bit stream. The cell may communicate with its neighbor cells to receive their pixel values, presented as deterministic bit streams. In this way, an image processing circuit may be constructed using the techniques described herein so as to process pixel values using stochastic computational units even though data values are conveyed between the computational units using deterministic bit encodings.

Figure 17:
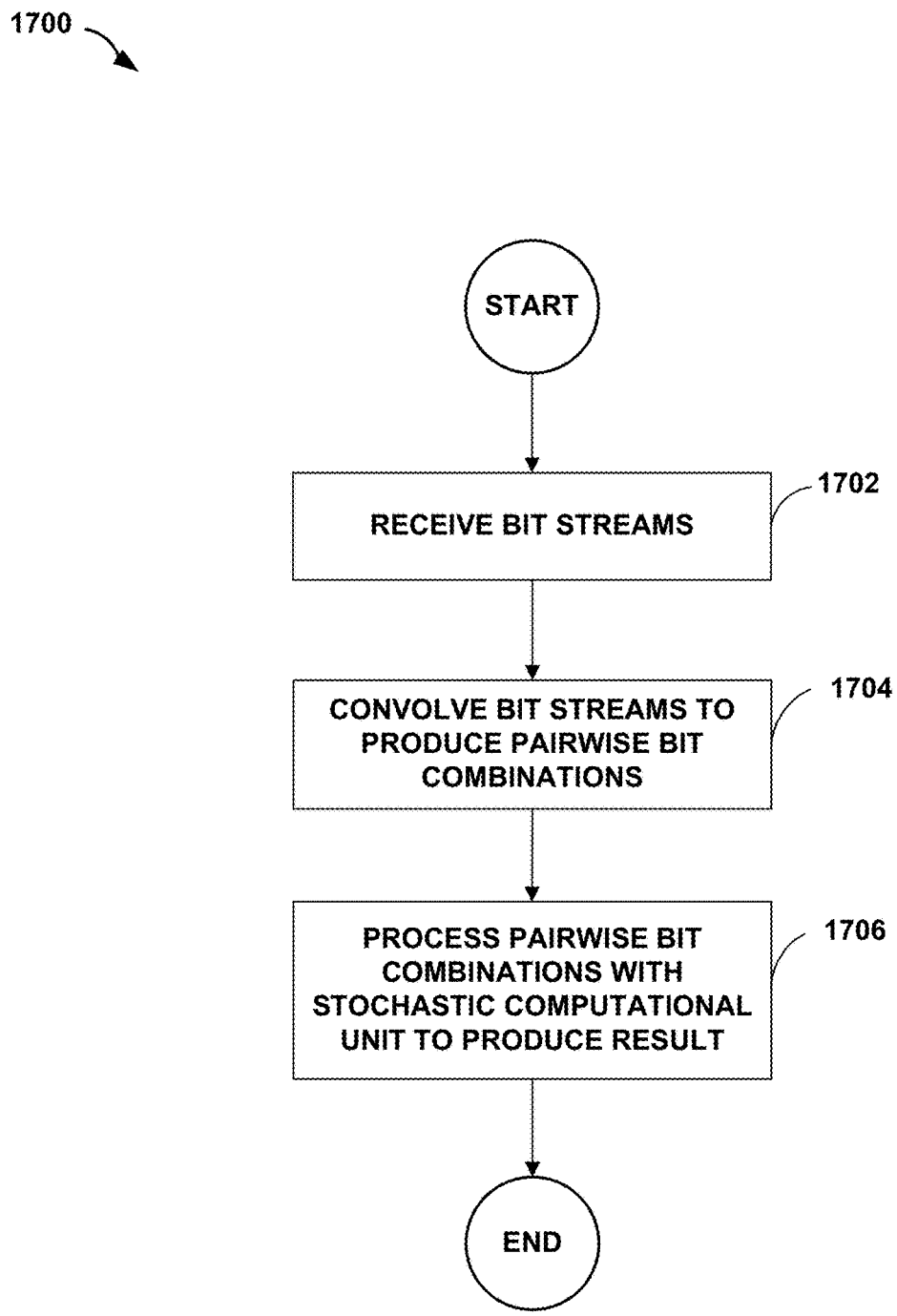
FIG. 17 is a flowchart illustrating an example technique for computation with deterministic bit streams, in some examples of this disclosure.

FIG. 17 is a flowchart illustrating an example process 1700 for computation with deterministic bit streams, in some examples of this disclosure. Technique 1700 is described with reference to the system of FIG. 1, including computational unit 110A, although other components, such as cell 1602 in FIG. 16, may perform similar techniques.

The technique of FIG. 17 includes stochastic computational unit 114B receiving a first input bit stream 118A and a second input bit stream 118D (1702). Each of the first input bit stream 118A and second input bit stream 118D comprises a sequential set of data bits. In some examples, each of input bit streams 118A and 118D may include two or more sets of data bits in parallel. Moreover, each of the sets of data bits are deterministically encoded to represent numerical values based on a probability that any bit in the respective set of data bits is high.

Next, a convolver 112B within the computational unit (e.g., computational unit 110B) convolves the first input bit stream 118A and the second input bit stream 118D to generate pair-wise combinations of the data bits of the first input bit stream 118A and the data bits of the second input bit stream 118D (1704). Stochastic computational unit 114B may then process the pairwise combinations to produce an output bit stream 118C having a set of data bits indicating a result of the computational operation, wherein the data bits of the output bit stream 118C represent the result based on a probability that any bit in the set of data bits of the output bit stream 118C is high (1706).

Various embodiments of the invention have been described. These and other embodiments are within the scope of the following claims.

The invention claimed is:

1. A device comprising:
an integrated circuit comprising a computational unit configured to process at least a first set of data bits encoding a first numerical value and a second set of data bits encoding a second numerical value,
wherein the computational unit comprises:
a convolver configured to generate pair-wise bit combinations of a first bit sequence and a second bit sequence that deterministically encode the first and second numerical values, respectively, based on a proportion of the data bits in the sequence that are high relative to the data bits in the sequence that are low, wherein a subset of the plurality of pair-wise bit combinations pairs a data bit of the first bit sequence with multiple different data bits of the second bit sequence, and
a stochastic computational unit configured to:
perform a computational operation on the pair-wise bit combinations; and
produce an output bit stream having a set of data bits indicating a result of the computational operation, wherein the data bits of the output bit stream represent the result based on a probability that any data bit in the set of data bits of the output bit stream is high.

2. The device of claim 1, wherein the convolver is configured to perform convolution on the data bits of the first bit sequence and the data bits of the second bit sequence to generate the pair-wise bit combinations by at least implementing one of:
a relatively prime method in which a length of the first bit sequence is prime relative to a length of the second bit sequence,
a rotation method in which rotated versions of the first bit sequence are paired with the second bit sequence, or
a clock division method in which the first bit sequence is paired with clock divided versions of the second bit sequence.

3. The device of claim 1, wherein the convolver comprises a set of converter modules configured to perform convolution on the data bits of the first bit sequence and the data bits of the second bit sequence to generate the pair-wise bit combinations.

4. The device of claim 3, wherein each converter module of the set of converter modules corresponds to one of the first set of data bits and the second set of data bits, and wherein each converter module comprises:
a counter that iterates through a maximum range of the respective set of data bits; and
a comparator that, for each iteration of the counter, compares an output of the counter with the respective set of data bits to produce a data bit of the pair-wise bit combination.

5. The device of claim 4, wherein each converter module of the set of converter modules independently operates on the proportions without interconnection to be capable of operating on proportions of relatively prime lengths.

6. The device of claim 4, wherein the counter of a first converter module is configured to stall at least once for every cycle through the maximum range to generate a rotated proportion of the first bit sequence.

7. The device of claim 4, wherein the set of converter modules is chained together to form a clock division unit capable of operating on proportions of arbitrary length, such that a counter of a second converter module is configured to iterate only once for every cycle through the maximum range by a counter of a first converter module.

8. The device of claim 1, wherein the convolver generates pair-wise bit combinations for at least a programmable threshold number of data bits from the first bit sequence and the second bit sequence in accordance with a target accuracy.

9. The device of claim 1, wherein the computational unit further comprises a downsampler configured to reduce a length of the output bit stream to a target precision.

10. The device of claim 1, wherein a length of the output bit stream that is a product of a length of the first bit sequence and a length of the second bit sequence.

11. A method of operating an integrated circuit comprising a computational unit, the method comprising:
receiving, at the computational unit, a first set of data bits encoding a first numerical value and a second set of data bits encoding a second numerical value;
convolving, by a convolver, a first bit sequence and a second bit sequence that deterministically encode the first and second numerical values, respectively, based on a proportion of the data bits in the sequence that are high relative to the data bits in the sequence that are low, to generate pair-wise bit combinations of the first bit sequence and the second bit sequence, wherein a subset of the plurality of pair-wise bit combinations pairs a data bit of the first bit sequence with multiple different data bits of the second bit sequence; and processing the pair-wise bit combinations with a stochastic computational unit to produce an output bit stream having a set of data bits indicating a result of a computational operation, wherein the data bits of the output bit stream represent the result based on a probability that any data bit in the set of data bits of the output bit stream is high.

12. The method of claim 11, wherein convolving the first bit sequence and the second bit sequence comprises performing convolution on at least a threshold number of the data bits of bit sequences by at least implementing a relatively prime method in which a length of the first bit sequence is prime relative to a length of the second bit sequence.

13. The method of claim 11, wherein convolving the first bit sequence and the second bit sequence comprises performing convolution on at least a threshold number of the data bits of bit sequences by at least implementing a rotation method in which rotated versions of the first bit sequence are paired with the second bit sequence.

14. The method of claim 11, wherein convolving the first bit sequence and the second bit sequence comprises performing convolution on at least a threshold number of the data bits of bit sequences by at least implementing a clock division method in which the first bit sequence is paired with clock divided versions of the second bit sequence.

15. The method of claim 11, wherein convolving the first input bit stream and the second input bit stream comprises:
  iterating, by a counter, through a maximum range of the respective set of data bits; and
  comparing, for each iteration of the counter, an output of the counter with the respective set of data bits to produce a data bit of the pair-wise bit combination.

16. The method of claim 11, further comprising:
  generating pair-wise bit combinations for at least a programmable threshold number of data bits from the first bit sequence and the second bit sequence in accordance with a target accuracy.

17. The method of claim 11, further comprising reducing a length of the output bit stream to a target precision.

18. A method comprising:
  convolving, by a convolver, two deterministically encoded bit streams of operands to produce convolved bit streams, wherein each encoded bit stream of the encoded bit streams represents a respective number by a fraction of ones versus zeroes, and wherein a subset of data bits of a first convolved bit stream is paired with multiple different data bits of a second convolved bit stream; and processing the convolved bit streams with circuit structures implementing stochastic logic operations to perform an arithmetic operation on the convolved bit streams.

19. The method of claim 18,
  wherein convolving the two deterministically encoded bit streams of operands comprises generating pair-wise bit combinations for at least a programmable threshold number of data bits from each encoded bit streams of the two deterministically encoded bit streams in accordance with a target accuracy;
  wherein processing the convolved bit streams comprises producing an output bit stream; and
  wherein the method further comprises reducing a length of the output bit stream to a target precision.

20. The method of claim 18, wherein convolving the two deterministically encoded bit streams of operands comprises implementing one of:
  a relatively prime method in which a length of the first encoded bit stream is prime relative to a length of the second encoded bit stream,
  a rotation method in which rotated versions of the first encoded bit stream are paired with the second encoded bit stream, or
  a clock division method in which the first encoded bit stream is paired with clock divided versions of the second encoded bit stream.

* * * * *